United States Patent
Yu et al.

(10) Patent No.: US 12,288,721 B2
(45) Date of Patent: Apr. 29, 2025

(54) FIN BENDING REDUCTION THROUGH STRUCTURE DESIGN

(71) Applicant: Taiwan Semiconductor Manufacturing Co., Ltd., Hsinchu (TW)

(72) Inventors: De-Wei Yu, Ping-Tung (TW); Ming-Feng Hsieh, New Taipei (TW); Hsueh-Chang Sung, Zhubei (TW); Pei-Ren Jeng, Chu-Bei (TW); Yee-Chia Yeo, Hsinchu (TW); Chien-Chia Cheng, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 536 days.

(21) Appl. No.: 17/648,147

(22) Filed: Jan. 17, 2022

(65) Prior Publication Data
US 2023/0011474 A1    Jan. 12, 2023

Related U.S. Application Data

(60) Provisional application No. 63/219,412, filed on Jul. 8, 2021.

(51) Int. Cl.
*H01L 21/8234* (2006.01)
*H01L 27/088* (2006.01)
(Continued)

(52) U.S. Cl.
CPC ........ *H01L 21/823431* (2013.01); *H01L 21/823418* (2013.01); *H01L 21/823481* (2013.01);
(Continued)

(58) Field of Classification Search
CPC ........ H01L 21/823431; H01L 27/0086; H01L 29/0847; H01L 21/823418;
(Continued)

(56) References Cited

U.S. PATENT DOCUMENTS

| 10,269,908 B2 | 4/2019 | Chang et al. |
| 10,998,428 B2 | 5/2021 | Chang et al. |

(Continued)

FOREIGN PATENT DOCUMENTS

| KR | 20160100924 A | 8/2016 |
| KR | 20160132523 A | 11/2016 |

(Continued)

*Primary Examiner* — Igwe U Anya
(74) *Attorney, Agent, or Firm* — Slater Matsil, LLP

(57) ABSTRACT

A method includes etching a semiconductor substrate to form a trench between a first semiconductor strip and a second semiconductor strip. The first semiconductor strip has a first width at about 5 nm below a top of the first semiconductor strip and a second width at about 60 nm below the top of the first semiconductor strip. The first width is smaller than about 5 nm, and the second width is smaller than about 14.5 nm. The trench is filled with dielectric materials to form an isolation region, which is recessed to have a depth. A top portion of the first semiconductor strip protrudes higher than the isolation region to form a protruding fin. The protruding fin has a height smaller than the depth. A gate stack is formed to extend on a sidewall and a top surface of the protruding fin.

20 Claims, 30 Drawing Sheets

(51) Int. Cl.
    *H01L 29/08* (2006.01)
    *H01L 29/66* (2006.01)
    *H01L 29/78* (2006.01)

(52) U.S. Cl.
    CPC ...... *H01L 27/0886* (2013.01); *H01L 29/0847* (2013.01); *H01L 29/66545* (2013.01); *H01L 29/66795* (2013.01); *H01L 29/7851* (2013.01)

(58) Field of Classification Search
    CPC ....... H01L 21/823481; H01L 29/66545; H01L 29/66795; H01L 29/7851
    USPC ......................................................... 257/401
    See application file for complete search history.

(56) References Cited

U.S. PATENT DOCUMENTS

| | | | |
|---|---|---|---|
| 11,302,535 B2 | 4/2022 | Tsai et al. | |
| 11,856,743 B2 | 12/2023 | Lee | |
| 12,100,735 B2 | 9/2024 | Cho | |
| 2014/0315371 A1 | 10/2014 | Cai et al. | |
| 2016/0284587 A1* | 9/2016 | Liou | H01L 21/823431 |
| 2016/0365453 A1* | 12/2016 | Kim | H01L 29/7853 |
| 2017/0062616 A1 | 3/2017 | Wu et al. | |
| 2017/0125597 A1* | 5/2017 | Kim | H01L 29/7855 |
| 2018/0151414 A1* | 5/2018 | Wu | H01L 27/0886 |
| 2019/0103284 A1 | 4/2019 | Yu | |
| 2019/0280086 A1* | 9/2019 | Karp | H01L 29/785 |
| 2021/0202478 A1 | 7/2021 | Guha et al. | |

FOREIGN PATENT DOCUMENTS

| | | |
|---|---|---|
| KR | 20180015099 A | 2/2018 |
| KR | 20180118028 A | 10/2018 |
| KR | 20190108348 A | 9/2019 |
| KR | 20200001444 A | 1/2020 |
| TW | 201923850 A | 6/2019 |
| TW | I762166 B | 4/2022 |

\* cited by examiner

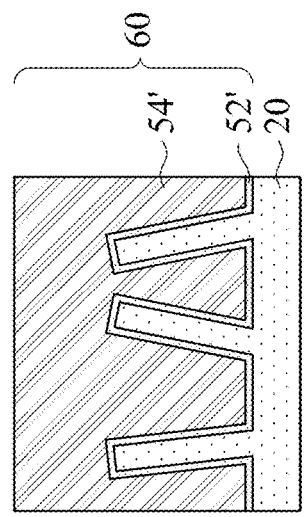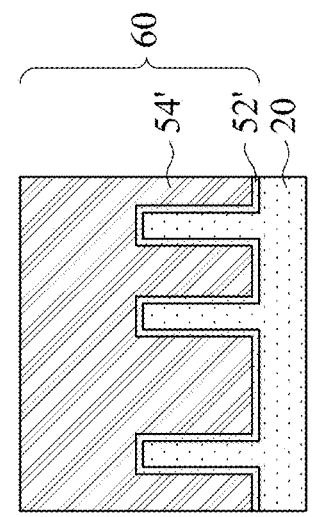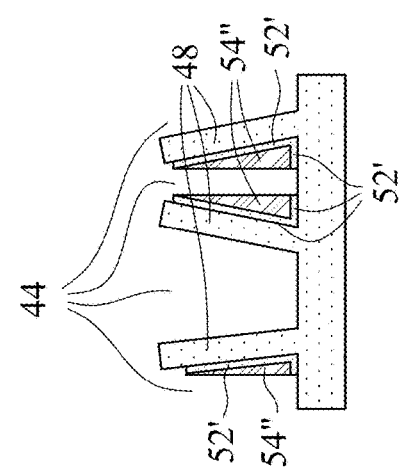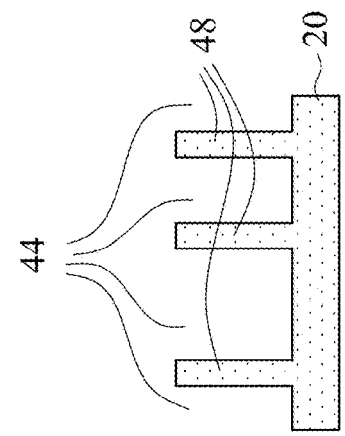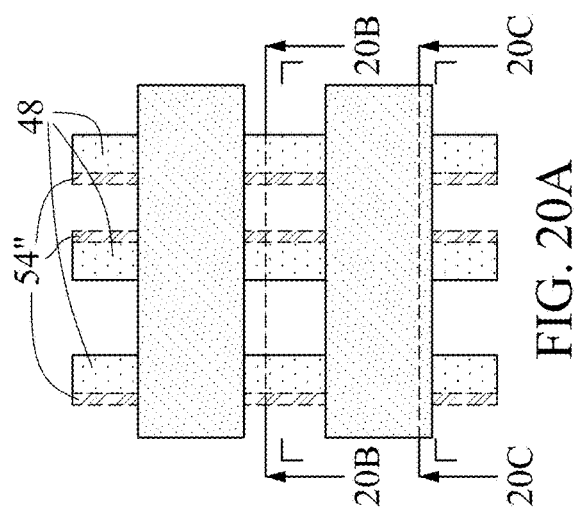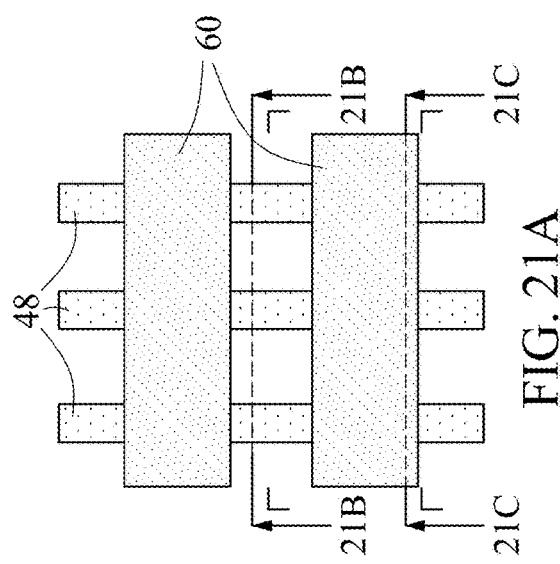

FIN BENDING REDUCTION THROUGH STRUCTURE DESIGN

PRIORITY CLAIM AND CROSS-REFERENCE

This application claims the benefit of the following provisionally filed U.S. Patent application: Application No. 63/219,412, filed on Jul. 8, 2021, and entitled "Fin Bending Modulation by Structure Design," which application is hereby incorporated herein by reference.

BACKGROUND

Technological advances in Integrated Circuit (IC) materials and design have produced generations of ICs, with each generation having smaller and more complex circuits than the previous generations. In the course of IC evolution, functional density (for example, the number of interconnected devices per chip area) has generally increased while geometry sizes have decreased. This scaling down process provides benefits by increasing production efficiency and lowering associated costs Such scaling-down has also increased the complexity of processing and manufacturing ICs and, for these advances to be realized, similar developments in IC processing and manufacturing are needed. For example, Fin Field-Effect Transistors (FinFETs) have been introduced to replace planar transistors. The structures of FinFETs and methods of fabricating FinFETs are being developed.

The formation of FinFETs typically involves forming semiconductor fins, forming dummy gate electrodes on the semiconductor fins, etching some portions of the semiconductor fins to form recesses, performing an epitaxy to regrow source/drain regions from the recesses, and replacing the dummy gate electrodes with replacement gates.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 20A, 20B and 20C illustrate a top view and cross-sectional views of bent protruding semiconductor fins in accordance with some embodiments.

FIGS. 21A, 21B and 21C illustrate a top view and cross-sectional views of vertical protruding semiconductor fins in accordance with some embodiments.

DETAILED DESCRIPTION

Figure 1:
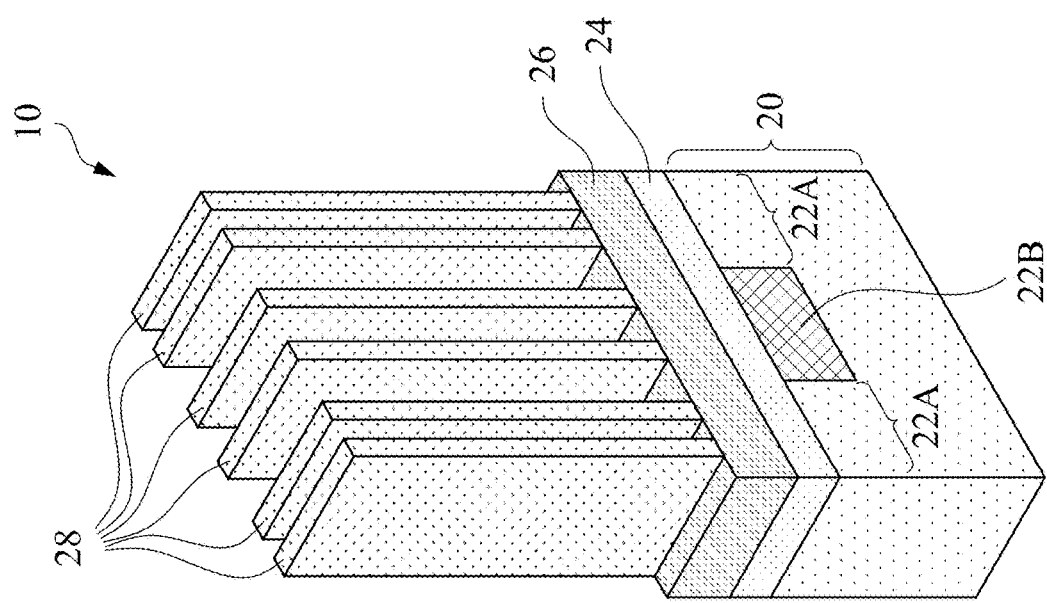
FIGS. 1-4, 5A, 5B, 6A, 6B, 7-19, and 22-26 illustrate the perspective views of intermediate stages in the formation of Fin Field-Effect Transistors (FinFETs) in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A method of reducing fin bending and the corresponding structures are provided. In accordance with some embodiments of the present disclosure, semiconductor strips are formed by etching a semiconductor substrate. Shallow Trench Isolation (STI) regions are formed between the semiconductor strips. The STI regions are recessed, and protruding semiconductor fins are formed higher than the top surfaces of the remaining STI regions. The fin heights of the protruding semiconductor fins are kept to be smaller than the heights of the STI regions. By maintaining the fin heights to be smaller than the heights of the STI regions, the fin bending may be smaller than a critical value, so that the residue of dummy gate stacks and replacement gate stacks remaining in the corresponding patterning process may be eliminated. Embodiments discussed herein are to provide examples to enable making or using the subject matter of this disclosure, and a person having ordinary skill in the art will readily understand modifications that can be made while remaining within contemplated scopes of different embodiments. Throughout the various views and illustrative embodiments, like reference numbers are used to designate like elements. Although method embodiments may be discussed as being performed in a particular order, other method embodiments may be performed in any logical order.

FIGS. 1-4, 5A, 5B, 6A, 6B, 7-19, and 22-26 illustrate the cross-sectional views of intermediate stages in the formation of Fin Field-Effect Transistors (FinFETs) in accordance with some embodiments of the present disclosure. The corresponding processes are also reflected schematically in the process flow shown in FIG. 31.

In FIG. 1, substrate 20 is provided. The substrate 20 may be a semiconductor substrate, such as a bulk semiconductor substrate, a Semiconductor-On-Insulator (SOI) substrate, or the like. The semiconductor substrate 20 may be a part of wafer 10, such as a silicon wafer. Generally, an SOI substrate is a layer of a semiconductor material formed on an insulator layer. The insulator layer may be, for example, a Buried Oxide (BOX) layer, a silicon oxide layer, or the like. The insulator layer is provided on a substrate, typically a silicon or glass substrate. Other substrates such as a multi-layered or gradient substrate may also be used. In some embodiments, the semiconductor material of semiconductor substrate 20 may include silicon; germanium; a compound semiconductor including carbon-doped silicon, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

In accordance with some embodiments, substrate 20 is a silicon substrate. A germanium-containing semiconductor region 22B is formed as a surface region of substrate 20, and may be used for forming a p-type transistor. In accordance with some embodiments, germanium-containing semiconductor region 22B comprises silicon germanium (SiGe), SiGeSn, GeSn, or the like, and the germanium percentage may be in the range between about 10 percent and about 40 percent. Semiconductor regions 22A are formed at a same level as semiconductor region 22B, and may be formed of or comprise silicon. Semiconductor regions 22A may be free from germanium.

Figure 31:
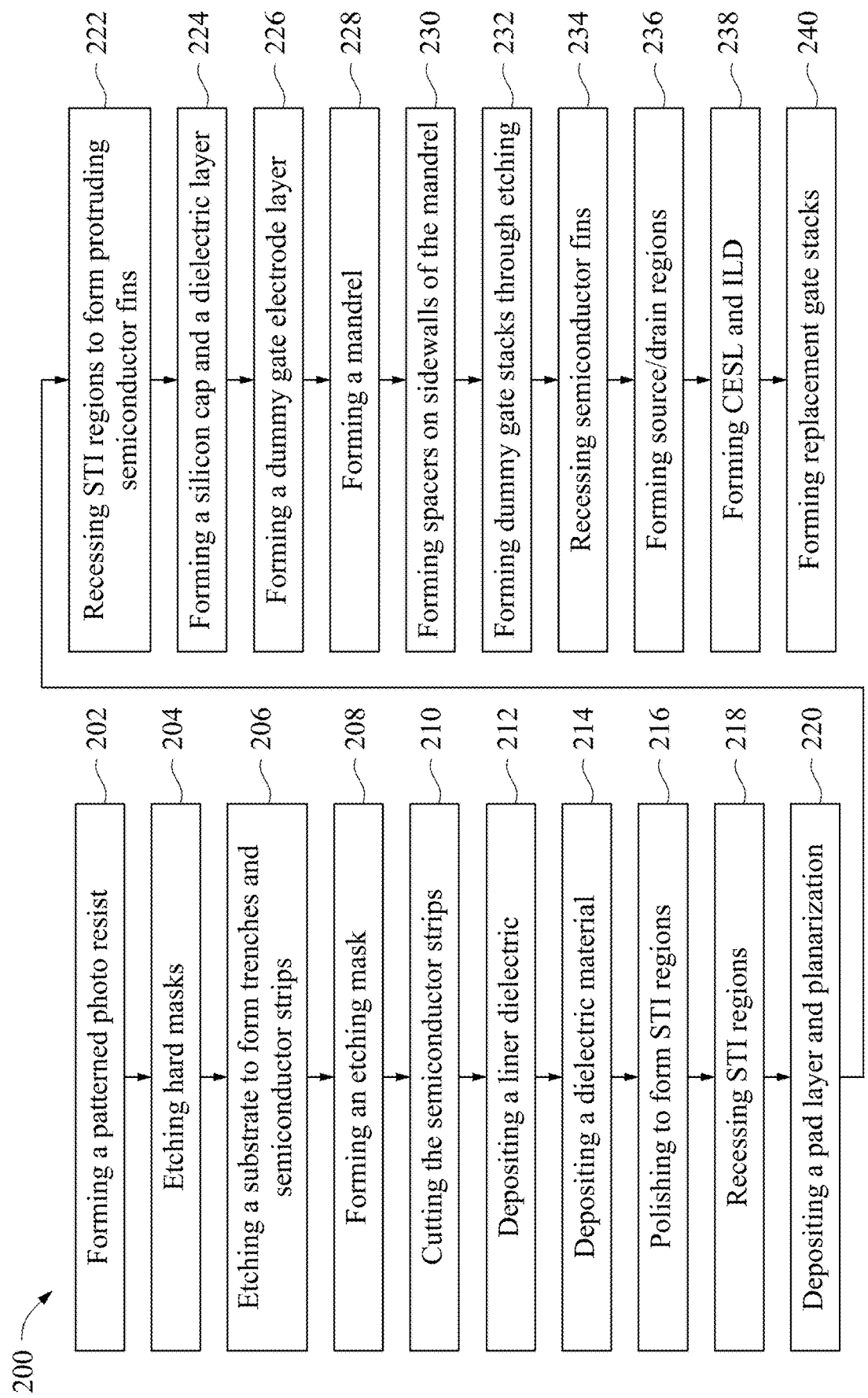
FIG. 31 illustrates a process flow for forming semiconductor fins and FinFETs in accordance with some embodiments.

Pad oxide layer 24 and hard mask layer 26 are formed on semiconductor substrate 20. Pad oxide layer 24 may be a thin film formed of silicon oxide. In accordance with some embodiments of the present disclosure, pad oxide layer 24 is formed through a deposition process. Pad oxide layer 24 acts as an adhesion layer between semiconductor substrate 20 and hard mask layer 26. Pad oxide layer 24 may also act as an etch stop layer for etching hard mask layer 26. In accordance with some embodiments of the present disclosure, hard mask layer 26 is formed of silicon nitride, for example, using Atomic Layer Deposition (ALD), Low-Pressure Chemical Vapor Deposition (LPCVD), Plasma Enhanced Chemical Vapor Deposition (PECVD), or the like. A patterned photo resist 28 is formed on hard mask layer 26. The respective process is illustrated as process 202 in the process flow 200 as shown in FIG. 31.

Figure 2:
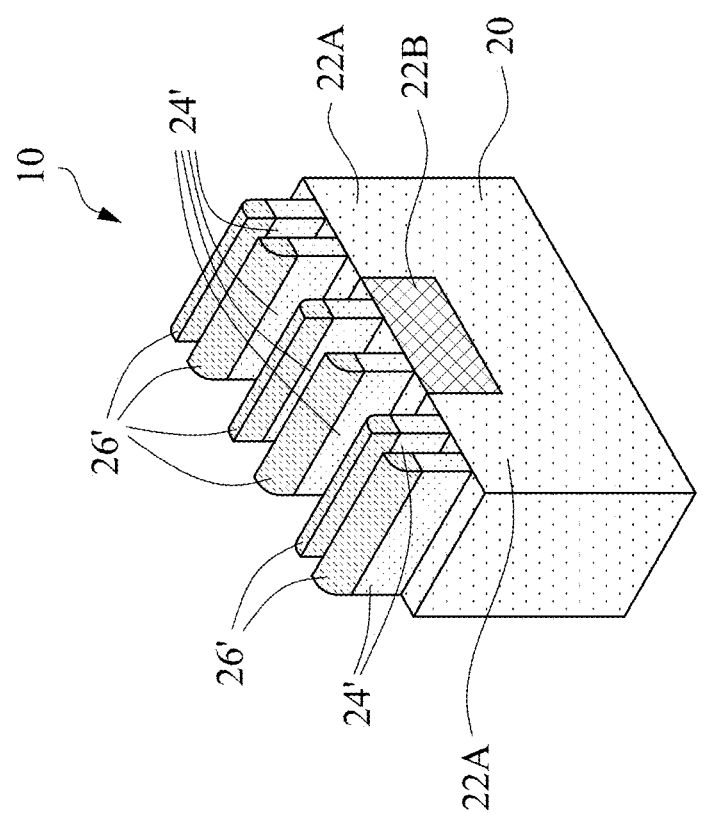

Next, hard mask layer 26 is patterned in an etching process using the patterned photo resist 28 as an etching mask, so that hard masks 26' are formed, as shown in FIG. 2. The respective process is illustrated as process 204 in the process flow 200 as shown in FIG. 31. Pad oxide layer 24 is then etched, and the remaining portions of pad oxide layer are denoted as pad oxide layers 24'. Semiconductor substrate 20 is thus exposed. Photo resist 28 is removed, either before or after the patterning of pad oxide layer 24. The resulting structure is shown in FIG. 2.

Figure 3:
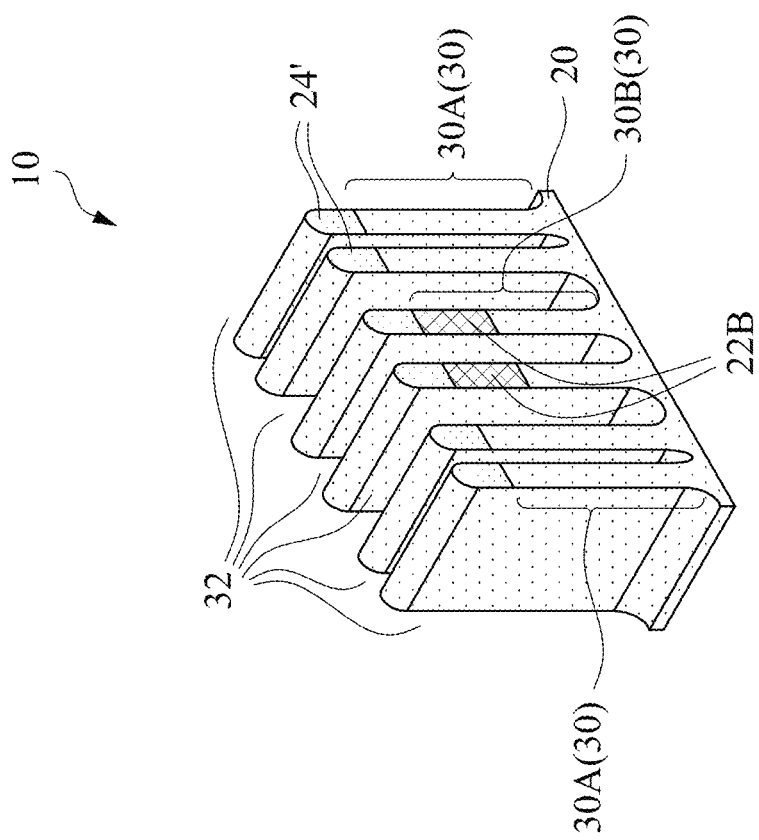

Referring to FIG. 3, the exposed semiconductor substrate 20 is etched in an anisotropic etching process, forming trenches 32. The respective process is illustrated as process 206 in the process flow 200 as shown in FIG. 31. The portions of semiconductor substrate 20 between neighboring trenches 32 are referred to as semiconductor strips 30 (including 30A and 30B) hereinafter. Trenches 32 may have the shape of strips (when viewed in the top view of wafer 10) that are parallel to each other, and trenches 32 are closely located from each other. In accordance with some embodiments of the present disclosure, the aspect ratio (the ratio of depth to width) of trenches 32 is greater than about 7, and may be greater than about 10. Semiconductor strips 30 include semiconductor strips 30A, which may include semiconductor regions 22A. Semiconductor strips 30 further include semiconductor strips 30B, which may include semiconductor strips as lower portions, and germanium-containing region strips 22B (which are the remaining portions of germanium-containing semiconductor region 22B) as upper portions. After the formation of trenches 32, hard masks 26' may be removed, as shown in FIG. 3, or may have some portions remaining.

Figure 4:
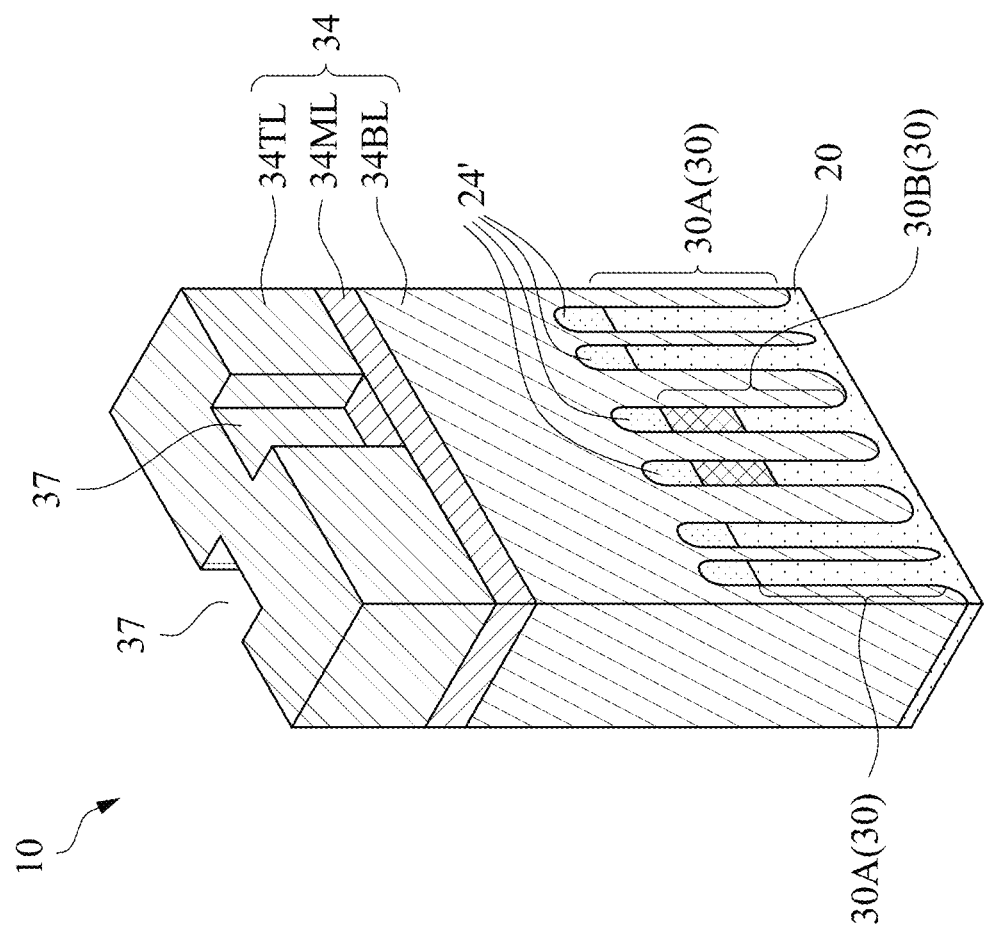
Figure 5B:
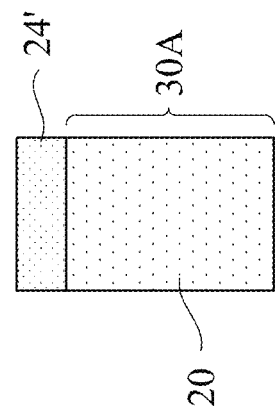
Figure 5A:
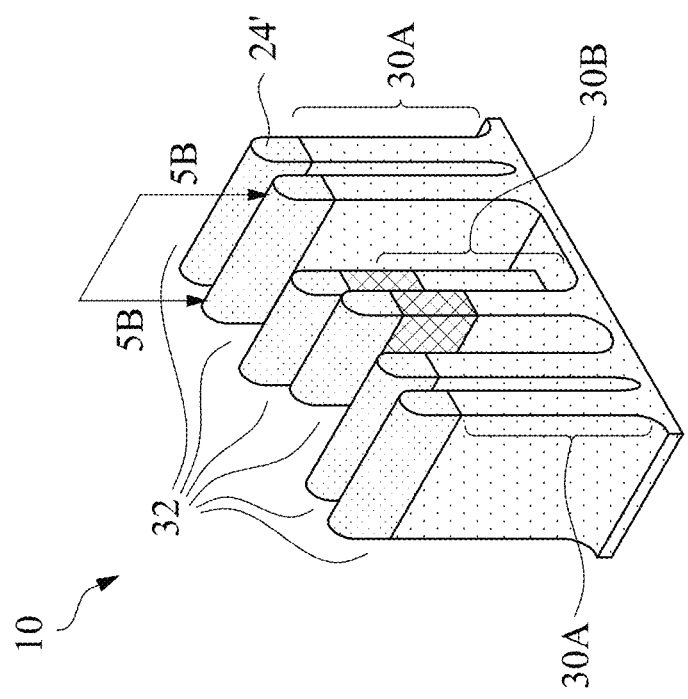

FIGS. 4 and 5A illustrate the patterning (cutting) of semiconductor strips 30. Referring to FIG. 4, an etching mask 34, which may be a tri-layer, is formed. The respective process is illustrated as process 208 in the process flow 200 as shown in FIG. 31. Etching mask 34 may include bottom layer (also sometimes referred to as an under layer) 34BL, middle layer 34ML over bottom layer 34BL, and top layer (also sometimes referred to as an upper layer) 34TL over middle layer 34ML. In accordance with some embodiments, bottom layer 34BL and top layer 34TL are formed of photo resists, with the bottom layer 34BL being cross-linked already. Middle layer 34ML may be formed of an inorganic material, which may be a nitride (such as silicon nitride), an oxynitride (such as silicon oxynitride), an oxide (such as silicon oxide), or the like. Middle layer 34ML has a high etching selectivity relative to top layer 34TL and bottom layer 34BL, and hence top layer 34TL may be used as an etching mask for patterning middle layer 34ML, and middle layer 34ML may be used as an etching mask for patterning bottom layer 34BL. Top layer 34TL is patterned to form openings 37.

The etching mask 34 as shown in FIG. 4 is used to cut semiconductor strips 30, wherein anisotropic etching processes are performed to etch middle layer 34ML, bottom layer 34BL, hard masks 26' (if any remaining) and pad oxide layers 24', and semiconductor strips 30. The respective process is illustrated as process 210 in the process flow 200 as shown in FIG. 31. The example cut semiconductor strips 30B are illustrated in FIG. 5A. FIG. 5B illustrates a cross-section 5B-5B of the structure shown in FIG. 5A, wherein one semiconductor strip 30A is illustrated. The cross-sectional views of semiconductor strips 30B are similar to that of semiconductor strips 30A, except the top portions of semiconductor strips 30B may be germanium-containing regions.

Figure 6B:
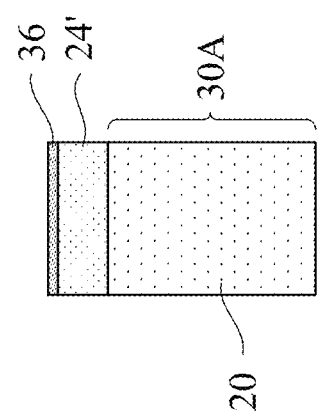
Figure 6A:
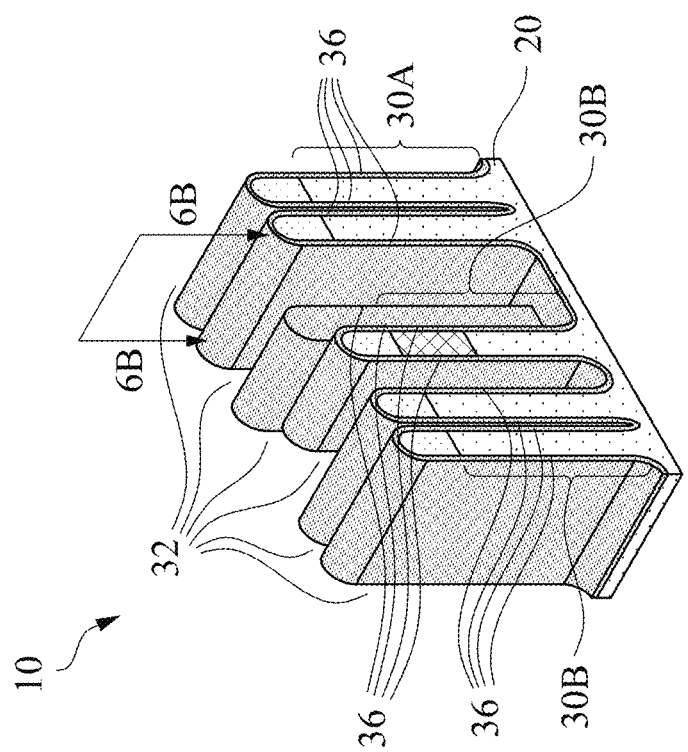

FIGS. 6A, 6B, 7, and 8 illustrate the formation of STI regions in accordance with some embodiments. Referring to FIG. 6A, liner dielectric 36 is formed at the bottoms of trenches 32 and extending on the sidewalls of semiconductor strips 30. The respective process is illustrated as process 212 in the process flow 200 as shown in FIG. 31. Liner dielectric 36 may be a conformal layer, whose horizontal portions and vertical portions have thicknesses close to each other, for example, with a thickness variation smaller than 20 percent or 10 percent. In accordance with some embodiments of the present disclosure, liner dielectric 36 is formed using a deposition method such as Chemical Vapor Deposition (CVD), Sub Atmospheric Chemical Vapor Deposition (SACVD), Atomic Layer Deposition (ALD), or the like. Liner dielectric 36 may be formed of or comprises silicon oxide, silicon nitride, or composite layers thereof. FIG. 6B illustrates a cross-section 6B-6B of the structure shown in FIG. 6A.

Figure 7:
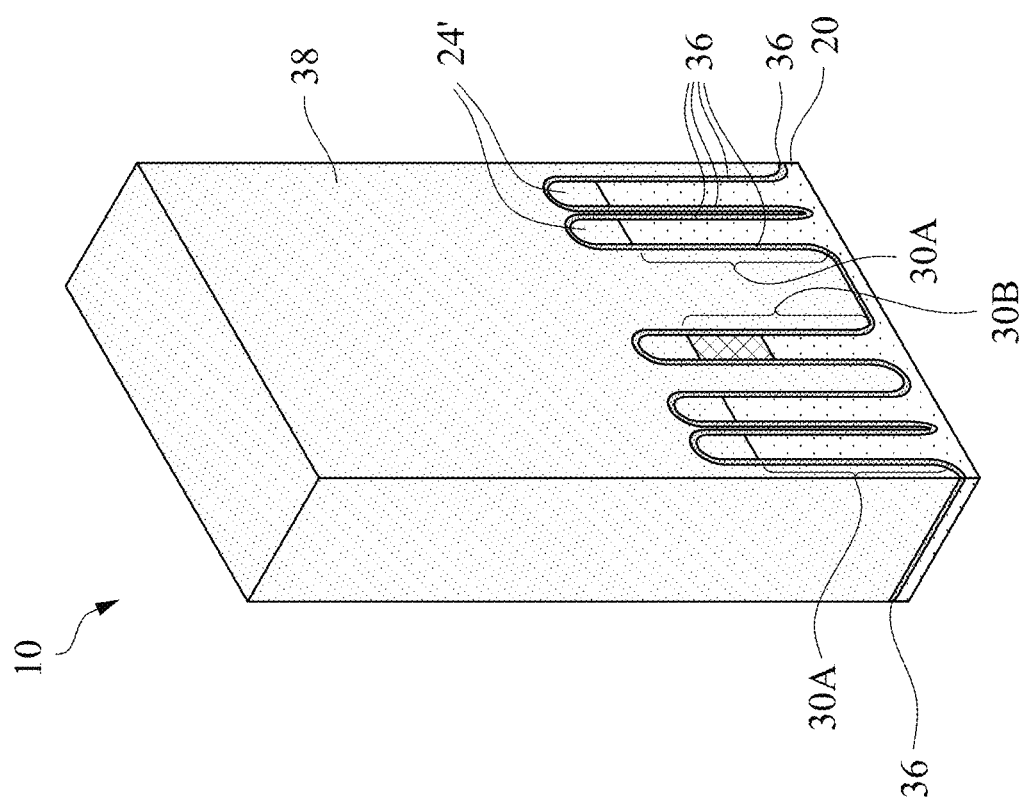

Dielectric material 38 is then deposited to fill the remaining portions of trenches 32, resulting in the structure shown in FIG. 7. The respective process is illustrated as process 214 in the process flow 200 as shown in FIG. 31. The deposition method of dielectric material 38 may be selected from Flowable Chemical Vapor Deposition (FCVD), spin-on coating, CVD, ALD, High-Density Plasma Chemical Vapor Deposition (HDPCVD), LPCVD, and the like. In accordance with some embodiments in which FCVD is used, a silicon-and-nitrogen-containing precursor (for example, trisilylamine (TSA) or disilylamine (DSA)) is used, and hence the resulting dielectric material 38 is flowable. In accordance with alternative embodiments of the present disclosure, the flowable dielectric material 38 is formed using an alkylamino silane based precursor. The deposition temperature may be in the range between about 300° C. and about 1,100° C. The pressure of the precursors may be in the range between about 0.01 Torr and about 760 Torr. The deposition time may be shorter than 10 hours.

After dielectric material 38 is deposited, an annealing/curing process is performed, which converts flowable dielectric material 38 into a solid dielectric material. The solidified dielectric material 38 is also referred to as dielectric material 38. In accordance with some embodiments of the present disclosure, the annealing process is performed in an oxygen-containing environment. The annealing temperature may be higher than about 200° C., for example, in a range between about 200° C. and about 700° C. During the annealing, an oxygen-containing process gas is conducted into the process chamber in which wafer 10 is placed. The oxygen-containing process gas may include oxygen ($O_2$), ozone ($O_3$), or combinations thereof. Steam ($H_2O$) may also be used, and may be used along with or without oxygen ($O_2$) or ozone. As a result of the annealing process, dielectric material 38 is cured and solidified.

Figure 8:
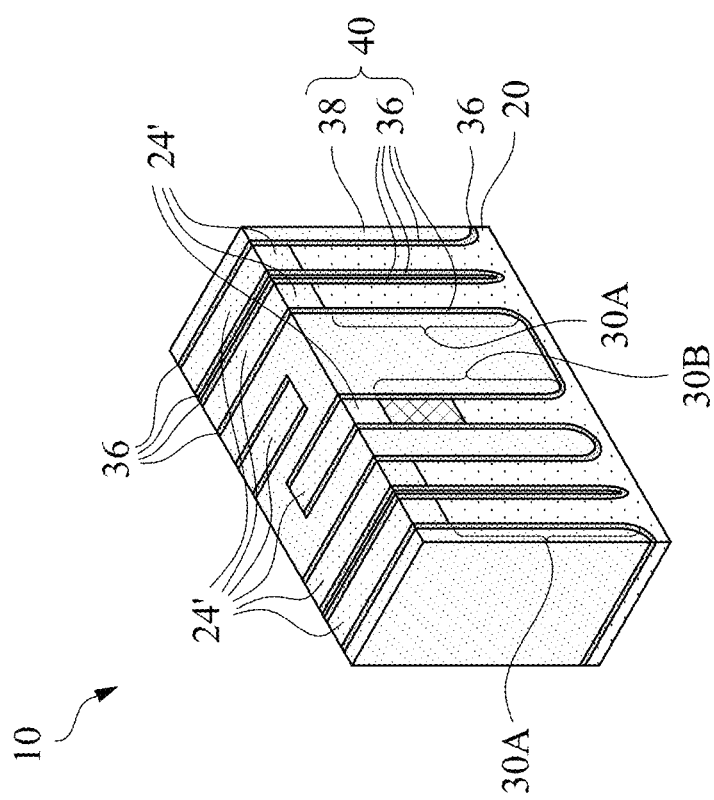

A planarization process such as a Chemical Mechanical Polish (CMP) process or a mechanical grinding process is then performed, as shown in FIG. 8. The respective process is illustrated as process 216 in the process flow 200 as shown in FIG. 31. STI regions 40 are thus formed, which include the remaining portions of liner dielectric 36 and dielectric material 38. Hard masks 26' (if remaining) or pad oxide layers 24' may be used as the CMP stop layer, and hence the top surface of STI regions 40 are level with the top surfaces of hard masks 26' or pad oxide layers 24'.

Figure 9:
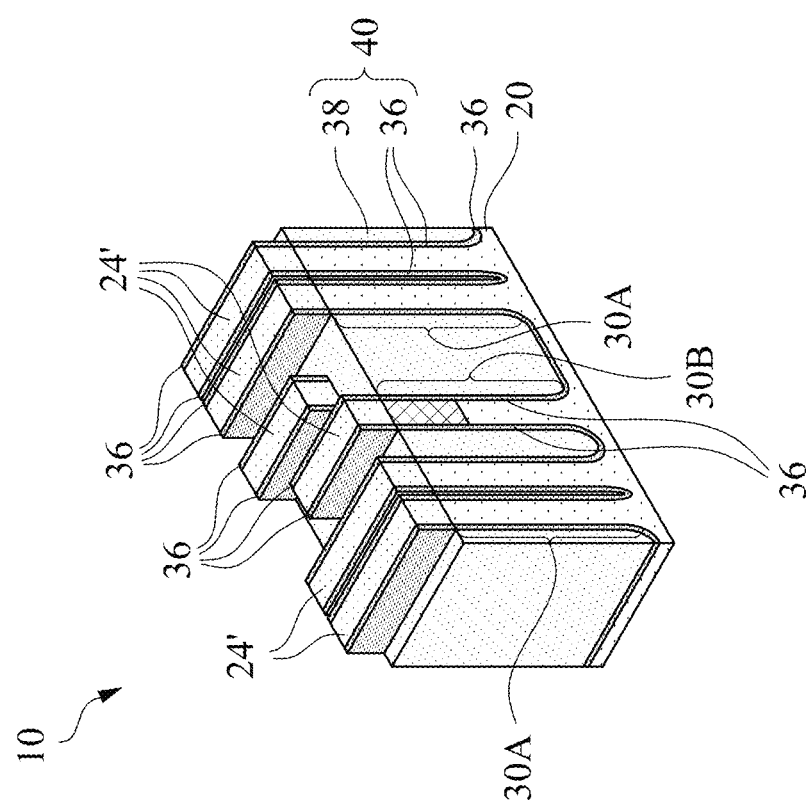

FIG. 9 illustrates the recessing of STI regions 40, which recessing process is performed, for example, through an isotropic etching process. The respective process is illustrated as process 218 in the process flow 200 as shown in FIG. 31. The height of the remaining STI regions 40 may be in the range between about 10 nm and about 80 nm. The etching process may be a dry etching process, which may be performed using the mixture of $NF_3$ and $NH_3$ or the mixture of HF and $NH_3$. Alternatively, the etching process may be a wet etching process, which may be performed using diluted HF solution as the etchant.

Figure 10:
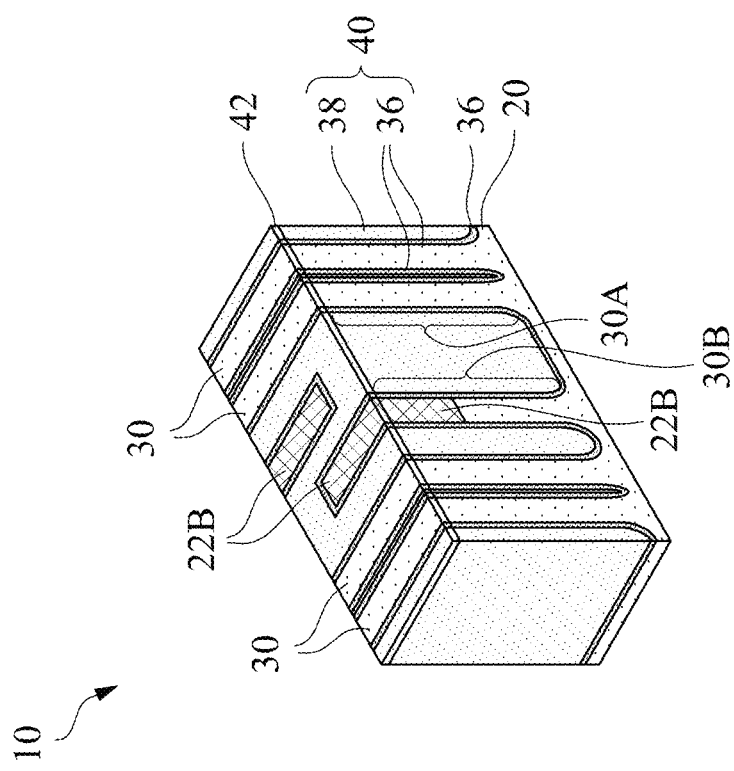
Figure 11:
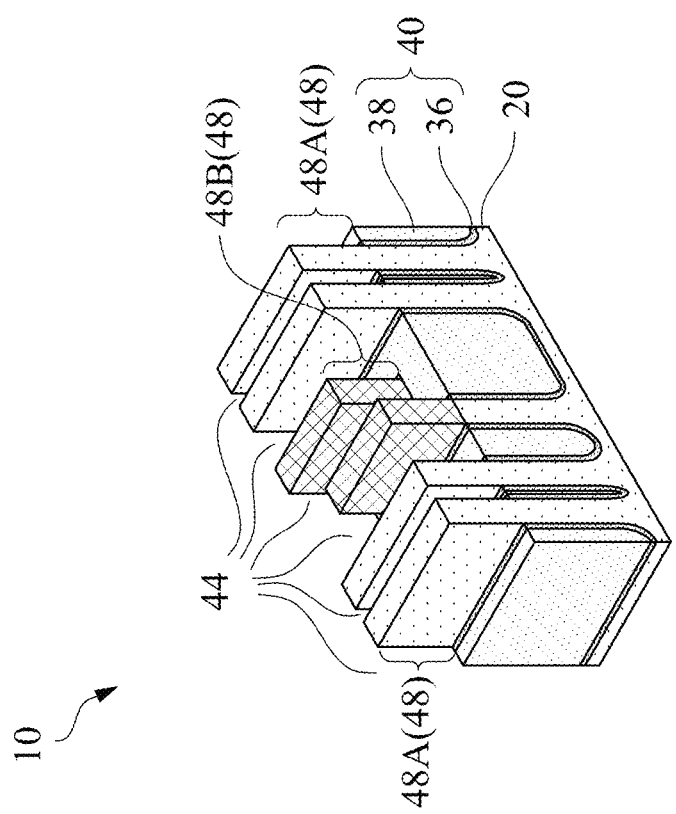

FIG. 10 illustrates the formation and the planarization of pad layer 42. The respective process is illustrated as process 220 in the process flow 200 as shown in FIG. 31. In accordance with some embodiments, pad layer 42 comprises an oxide layer (such as a silicon oxide layer), a nitride layer (such as a silicon nitride layer), or a composite layer including an oxide layer, and a nitride layer overlying or underlying the oxide layer. The pad layer 42 fills the recesses formed due to the recessing of STI regions 40. Next, a planarization process is performed. The planarization process may be performed using semiconductor strips 30 as being a CMP stop layer. Accordingly, after the planarization process, semiconductor strips 30 are exposed, and the top surfaces of semiconductor strips 30 are level with the top surface of pad layer 42.

Pad layer 42 is then removed. Next, referring to FIG. 11, STI regions 40 are recessed to form trenches 44. The respective process is illustrated as process 222 in the process flow 200 as shown in FIG. 31. The top portions of semiconductor strips 30 thus protrude higher than the top surfaces of the remaining portions of STI regions 40 to form protruding fins 48 (including 48A and 48B). The etching may be performed using a dry etching process, wherein HF and $NH_3$, for example, are used as the etching gases. During the etching process, plasma may be generated. Argon may also be included. In accordance with alternative embodiments of the present disclosure, the recessing of STI regions 40 is performed using a wet etching process. The etching chemical may include HF, for example. Protruding fins 48 include protruding fins 48A, which are silicon fins, and protruding fins 48B, which are or comprise silicon germanium fins.

Protruding fins 48 may suffer from bending. In accordance with some embodiments, processes are selected to reduce the bending of protruding fins 48. Processes may also be controlled so that some portions (such as portions 48' in FIG. 28) of protruding fins 48 are laterally expanded, and are at selected positions, to strengthen the protruding fins 48, and to reduce the bending of protruding fins 48. The details for reducing the bending are discussed subsequently with reference to FIGS. 27 through 30.

Figure 27:
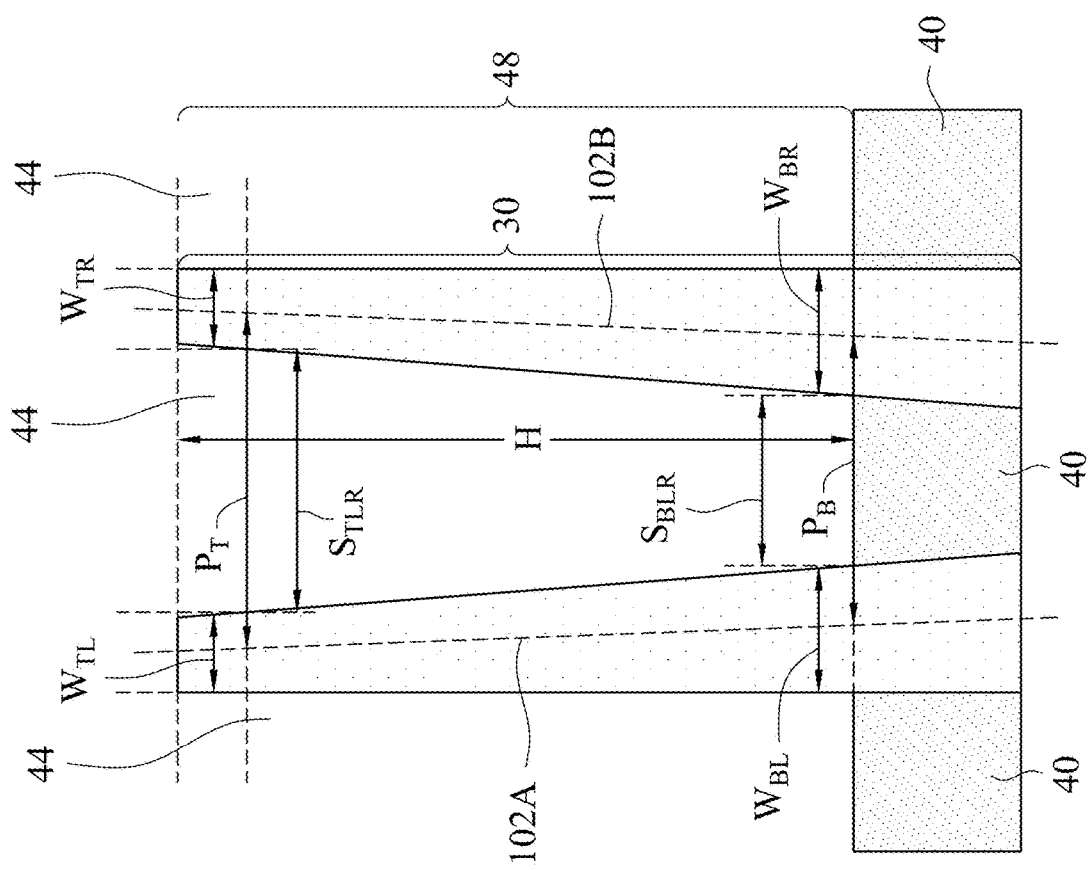
FIG. 27 illustrates the determination of the bending of neighboring semiconductor fins in accordance with some embodiments.

FIG. 27 illustrates the determination of the magnitude of the bending of protruding fins 48. The magnitude of the bending is also referred to as the bending value of protruding fins 48. Two semiconductor strips 30 are neighboring each other. Protruding fins 48 are the top portions of the semiconductor strips 30, which top portions are higher than the top surfaces of STI regions 40. The left and right semiconductor strips 30 have middle lines 102A and 102B, respectively. When protruding fins 48 are bent, the spacings between middle lines 102A and 102B at higher levels are different from the spacings between middle lines 102A and 102B at lower levels. Since the top portions of protruding fins 48 are rounded, the top pitch $P_T$ of protruding fins 48, which top pitch is the spacing between middle lines 102A and 102B, is measured at a level that is 5 nm below the tops of protruding fins 48. The bottom pitch $P_B$ of protruding fins 48 is measured at the bottoms of protruding fins 48. Alternatively stated, the bottom pitch $P_B$ may be measured at the top of STI regions 40. The difference $|(P_T-P_B)|$, which is the absolute value of the difference between pitches $P_T$ and $P_B$, is referred to as being the bending (value) B of protruding fins 48. The bending value B may also be calculated as $|[(W_{TL}+W_{TR})/2+S_{TLR}]-[(W_{BL}+W_{BR})/2+S_{BLR}]|$, wherein widths $W_{TL}$ and $W_{BR}$ are the top widths (measured at 5 nm below top) of protruding fins 48, and widths $W_{BL}$ and $W_{BR}$ are the bottom widths of protruding fins 48. Spacing $S_{TLR}$ is the top spacing between left protruding fin 48 and right protruding fin 48. Spacing $S_{BLR}$ is the bottom spacing between left protruding fin 48 and right protruding fin 48.

It has been found that bending value B equal to 4 nm is a critical value significantly affecting the resulting device. For example, as will be discussed referring to FIGS. 20A, 20B, and 20C, when bending value B is greater than 4 nm, residues 54" (FIG. 20B) may be left unremoved when a dummy gate electrode layer is patterned to form a dummy gate. Also, in the subsequent etching of replacement gate stacks, residues of the replacement gate stacks may also be left when bending value B is greater than 4 nm. These residues may electrical short the features on opposite sides of the residues. When bending value B is smaller than 4 nm, on the other hand, no residues have been found. Accordingly, bending value B is to be maintained to be lower than 4 nm. Also, when ratio B/H is smaller than 0.1, no residues are found, wherein H (FIG. 27) is the height of protruding fins 48. Throughout the description, the bending value B that do not result in residue is referred to as a within-specification bending value B, which is smaller than 4 nm, and the within-specification bending value B satisfies the requirement (B/H<0.1).

Figure 26:
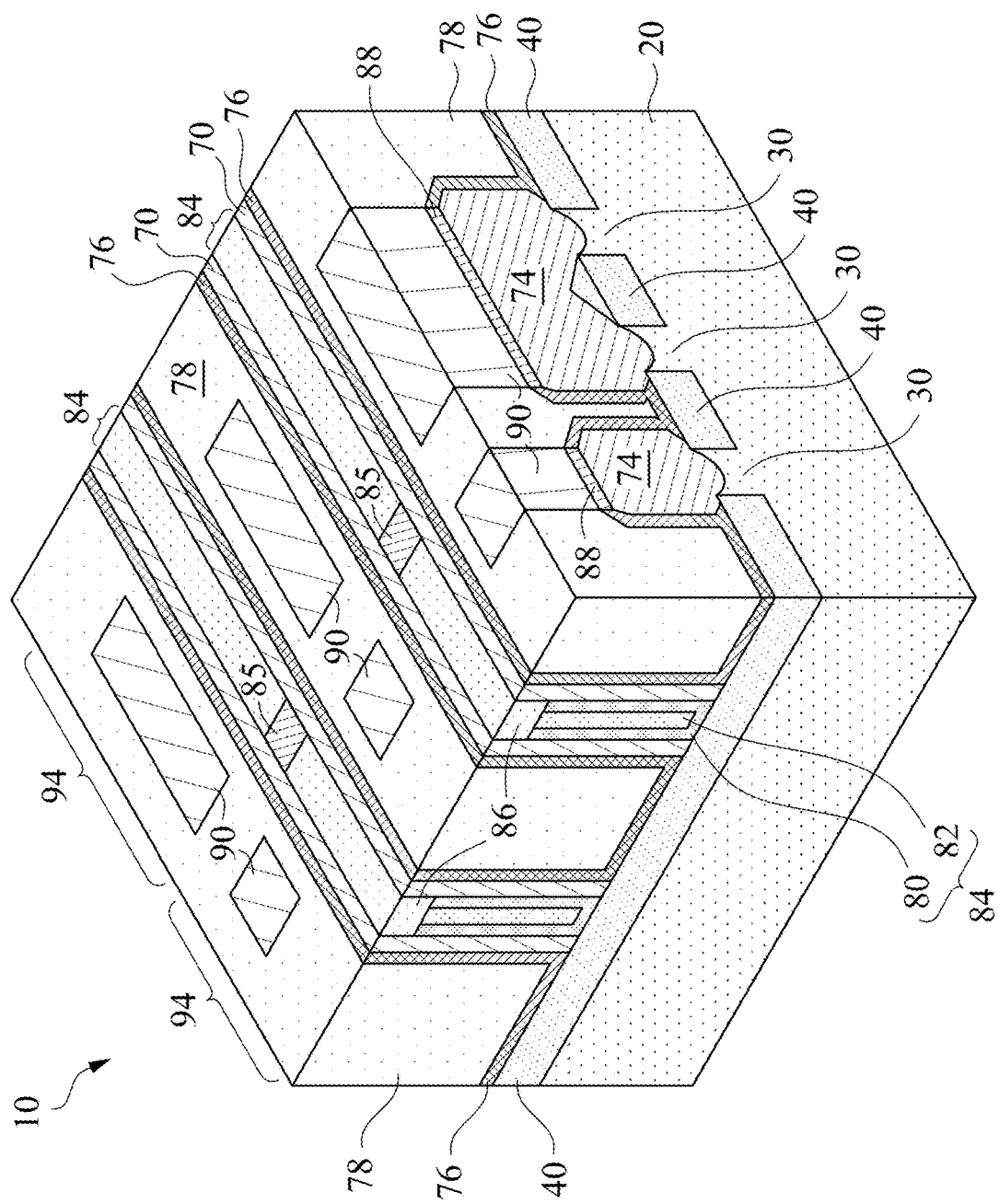
Figure 28:
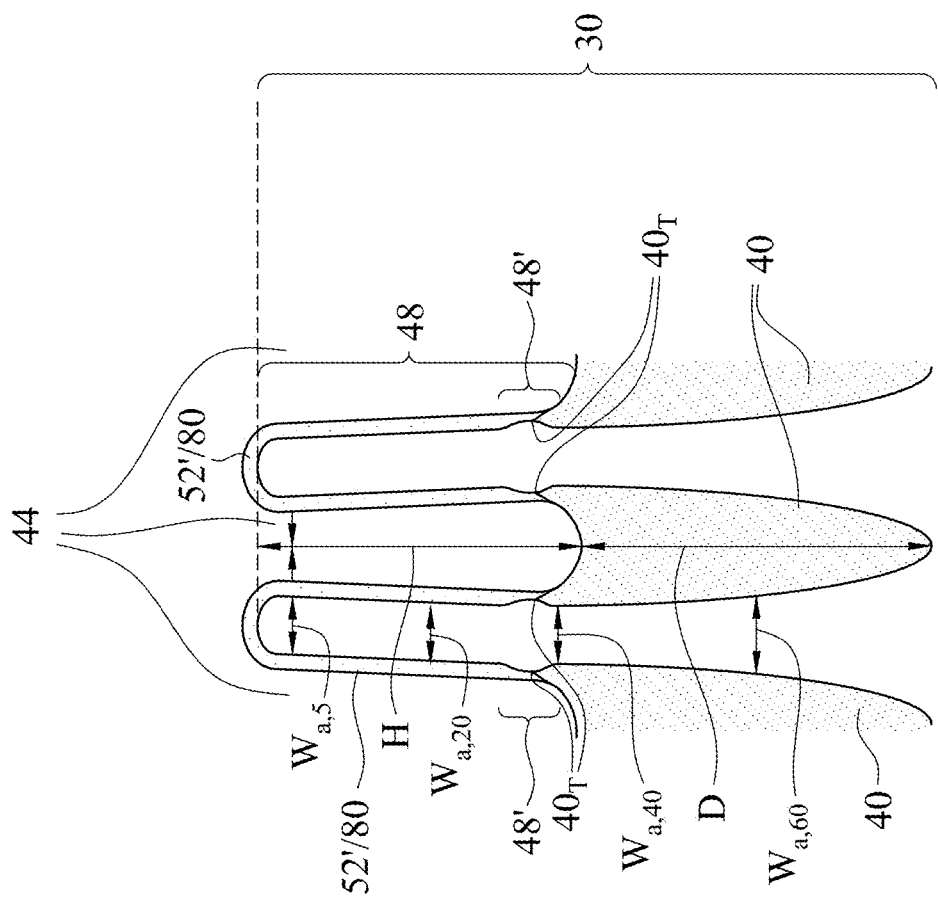
FIG. 28-30 illustrate the embodiments of reducing fin bending in accordance with some embodiments.

FIG. 28 illustrates the schematic view of a structure, which includes semiconductor strips 30, STI regions 40, and gate dielectrics 52'/80, which may be dummy gate dielectrics 52' or replacement gate dielectric 80 (FIG. 26). It has also been found that how much of the semiconductor strips 30 are embedded in STI regions 40 (and how much of the semiconductor strips 30 protrude over STI regions 40) affect the bending value B of protruding fins 48. When more of semiconductor strips 30 are embedded in, rather than protruding out of, STI regions 40, the bending value B is to be smaller than the within-specification bending value B. Alternatively stated, when ratio H/D is smaller than 1, bending value B will be smaller than the within-specification bending value B. Throughout the description, when the bending value B is described smaller than 4 nm, the bending value B may be 0 nm, or may be a non-zero value, for example, greater than about 0.5 nm or greater than about 1 nm. Accordingly, the bending value B may be in the range between about 0 nm, or in the range between about 1 nm and about 4 nm. Conversely, when the heights H of protruding fins 48 is equal to or greater than the depth D of the adjoining STI region(s) 40 (so that H/D is equal to or greater than 1), the bending value B is greater than the within-specification bending value B.

The ratio H/D may also be in the range between about 0.2 and about 0.9 in order to maintain the bending value B to be within specification with adequate process margin. Ratio H/D may also be in the range of between about 0.2 and about 0.5 to further reduce the bending, for example, when semiconductor strips 30 are very narrow. In accordance with some embodiments of the present disclosure, when ratio H/D is smaller than 1.0 (for example, when depth D is in the range between about 55 nm and about 80 nm, and when height H is in the range between about 10 nm and about 33 nm), the bending value B is within specification. The ratio B/H may be smaller than about 0.1. The reduction of ratio H/D may also effectively reduce bending value B for very thin and tall fins. For example, the thin-and-tall fins in accordance with the embodiments of the present disclosure may have width $W_{a,5}$ smaller than 5 nm, $W_{a,20}$ smaller than 6.5 nm, $W_{a,40}$ smaller than 8.3 nm, and $W_{a,60}$ smaller than 14.5 nm. Widths $W_{a,5}$, $W_{a,20}$, $W_{a,40}$, and $W_{a,60}$ are measured at levels 5 nm, 20 nm, 40 nm, and 60 nm, respectively, below the tops of protruding fins 48. In accordance with some embodiments, fin heights H may be in the range between about 40 nm and about 80 nm.

Figure 29:
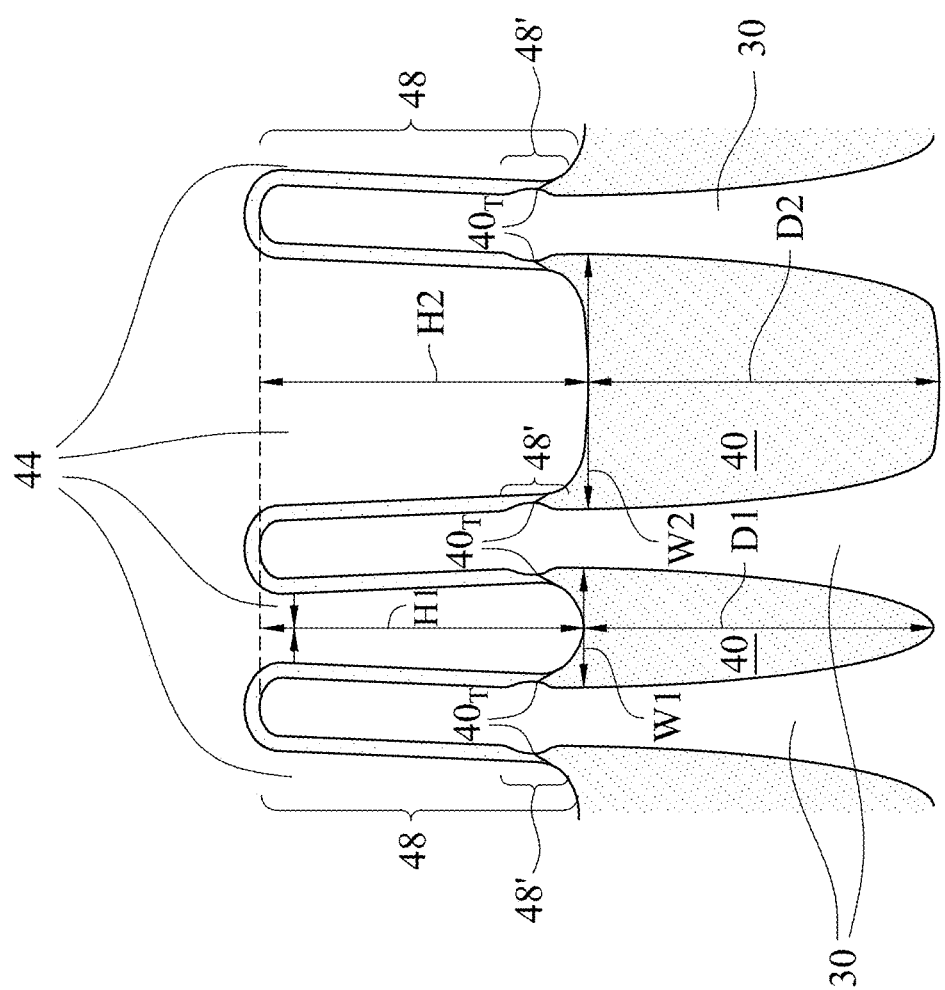
Figure 30:
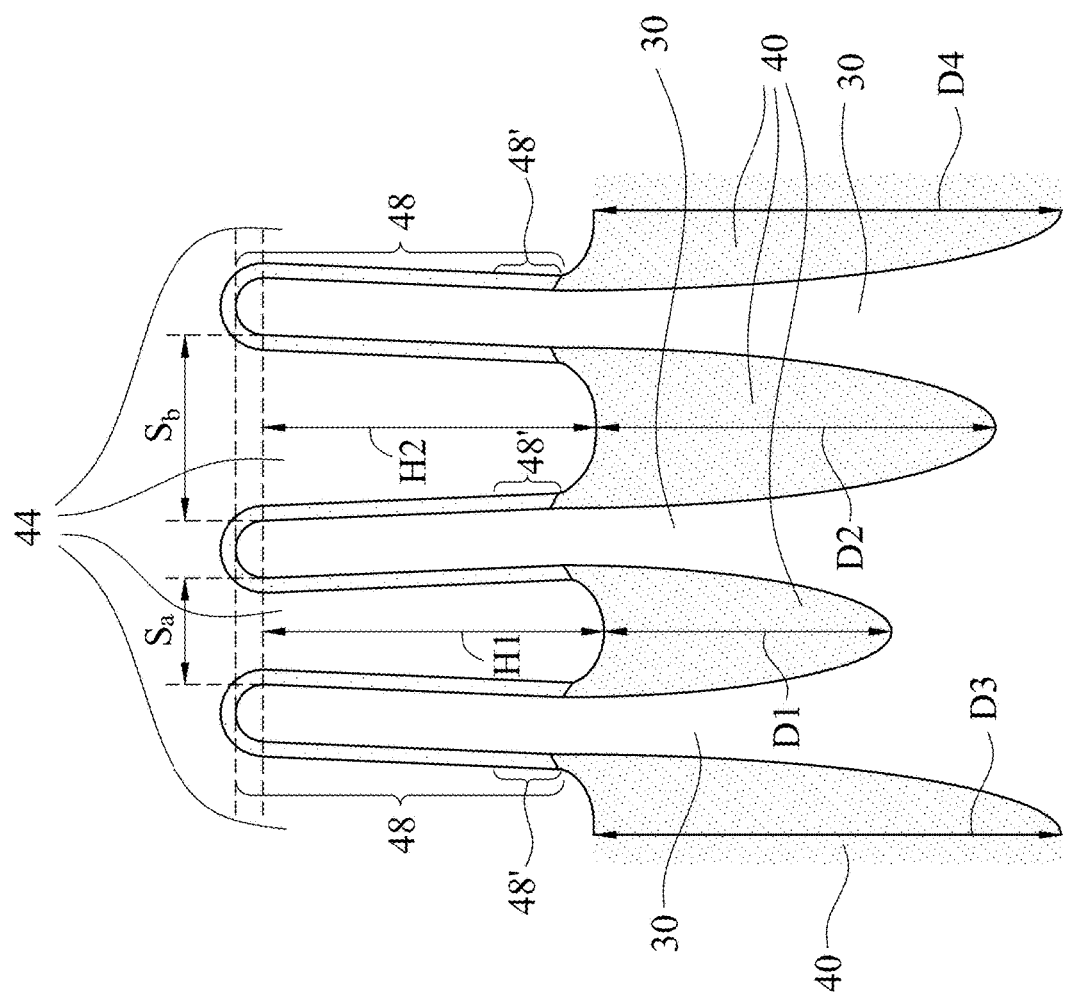

As shown in FIGS. 28, 29, and 30, in accordance with some embodiments, protruding fins 48 may have portions 48' that are laterally expanded to be wider than the overlying and underlying portions of protruding fins 48. The formation of wider portions 48' may be achieved by adjusting process conditions such as by adjusting the bias power in the process shown in FIG. 5A. For example, when etching the portions of semiconductor substrate on opposite sides of laterally-expanded portions 48', lower bias power may be used, while greater bias power may be used before and after forming laterally-expanded portions 48'. Laterally-expanded portions 48' may strengthen the protruding fins 48 to reduce the bending. Furthermore, the position of laterally-expanded portions 48' also affects the bending. In accordance with some embodiments, laterally-expanded portions 48' include some portions higher than top point $40_T$ (FIG. 28) of STI region 40. The bottoms of laterally-expanded portions 48' may be level with the top point $40_T$, or slightly lower than top point $40_T$.

FIG. 29 illustrates an embodiment in which two STI regions 40 are next to each other, with semiconductor strips 30 and protruding fins 48 being on the opposing sides of the STI regions 40. In accordance with some embodiments, to ensure the three illustrated protruding fins 48 all have bending value B to be within specification, both of ratios H1/D1 and H2/D2 are smaller than 1. Otherwise, assuming H1/D1 is greater than 1 (for example, when D1 is in the range between about 10 nm and about 30 nm), and H2/D2 is smaller than 1 (for example, when D2 is in the range between about 55 nm and about 80 nm), bending value B measured between the left and the middle protruding fin 48 may be greater than 4 nm (which is out of specification), and the bending value B measured between the middle and the right protruding fins 48 may be smaller than 4 nm (within specification). Again, the bending value B may be, or may not be, a non-zero value, for example, in the range between about 1 nm and about 4 nm. Accordingly, for a bending value B of a protruding fin 48 to have bending value B within specification, both of H1/D1 and H2/D2 are designed as being smaller than 1, and may be in the range between about 0.2 and about 0.9. Furthermore, the width W2 may be greater than width W1, for example, with ratio W2/W1 being greater than 2 or 3. This may further worsen the bending of the protruding fin 48 in the middle. With both of H1/D1 and H2/D2 being smaller than 1, the bending may be reduced. In FIG. 30, ratios D3/D1, D3/D2, D4/D1, and D4/D2 may be greater than about 1.2, greater than about 1.5, or greater than about 2 without affecting bending value B to be out of specification.

FIG. 30 illustrates an embodiment in which two STI regions 40 are next to each other, with semiconductor strips 30 and protruding fins 48 being on opposing sides of the STI regions. It is also found that when more than two protruding fins 48 are formed adjacent to each other, the spacings of a fin from its neighboring fins may be designed uniform and have values close to each other in order to reduce fin bending. For example, in FIG. 30, spacings $S_a$ and $S_b$ are marked. When spacings $S_a$ and $S_b$ are substantially equal to each other, for example, when the difference in spacing $|(S_a-S_b)|$ is smaller than 4 nm, the fin bending value B of the protruding fins are within specification, regardless of whether the ratios H1/D1 and/or H2/D2 are greater than 1 or smaller than 1, and B/H1 and B/H2 may be kept to be smaller than 0.1. Alternatively stated, when either one or both of the requirements (H/D<1) and ($|(S_a-S_b)|$<4 nm) is satisfied, the corresponding protruding fin 48 will have within-specification bending value B.

Furthermore, the depth D2 may be greater than depth D1, for example, with ratio D2/D1 being greater than about 1.2, greater than about 1.5, greater than about 2, or greater than about 5. Also, ratio (H2+D2)/(H1+D1) may also be greater than about 1.2, greater than about 1.5, or greater than about 2, wherein values (H2+D2) and (H1+D1) are the corresponding depths of trenches 32 (FIGS. 5A and 5B), in which STI regions 40 are formed. This may further worsen the bending of the protruding fin 48 in the middle due to different stresses applied by the STI regions 40 from the opposite sides. With both of the requirements (H/D<1) and ($|(S_a-S_b)|$<4 nm) being satisfied, the bending may be reduced.

In accordance with some embodiments, to ensure all of the protruding fins in an entire die and wafer have within-specification bending, all of the fins throughout the entire die and wafer meet at least one, or both, of requirements (H/D<1) and (|($S_a$-$S_b$)|<4 nm) in any combination. For example, in a device die, a first plurality of protruding fins may have within-specification bending because they satisfy the requirement (H/D<1), a second plurality of protruding fins may have within-specification bending because they satisfy the requirement (|($S_a$-$S_b$)|<4 nm), and a third plurality of protruding fins have within-specification bending because they satisfy both of the requirements (H/D<1) and (|($S_a$-$S_b$)|<4 nm). There will not be protruding fins in the die and wafer that fail to meet at least one of the requirements (H/D<1) and (|($S_a$-$S_b$)|<4 nm). Again, the bending value B may be, or may not be, a non-zero value, for example, in the range between about 1 nm and about 4 nm.

Figure 12:
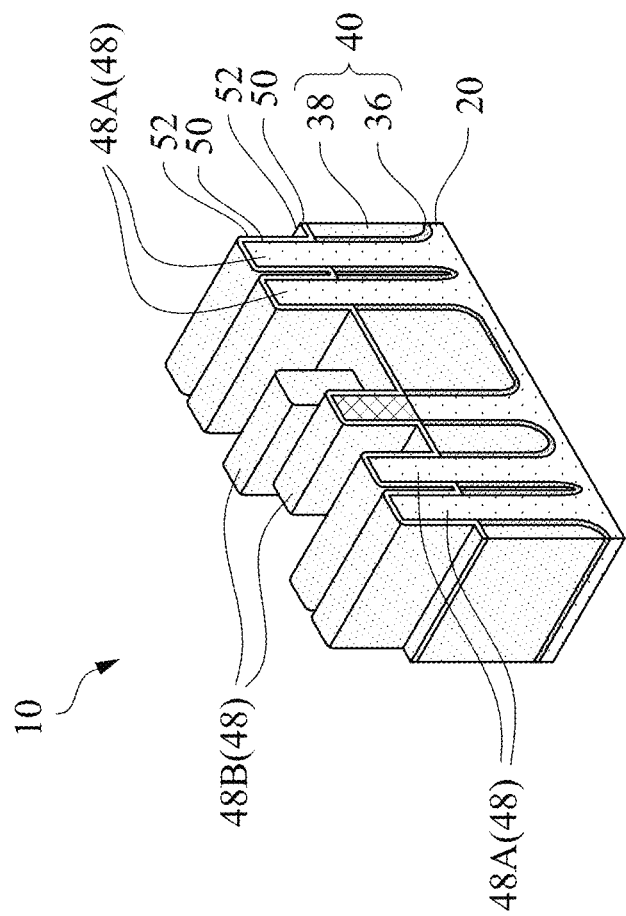

FIG. 12 illustrates the deposition of silicon capping layer 50 and dummy gate dielectric layer 52 over silicon capping layer 50. The respective process is illustrated as process 224 in the process flow 200 as shown in FIG. 31. In accordance with some embodiments, silicon capping layer 50 is formed through deposition. In accordance with some embodiments, silicon capping layer 50 is deposited using a silicon-containing precursor comprising silane, disilane, dichlorosilane (DCS), Trichlorosilane ($SiHCl_3$), Chlorosilane ($SiH_3Cl$), or the like. The deposition may be performed through a conformal deposition process such as a CVD process or an ALD process. When ALD is used, the precursors as aforementioned may be pulsed and purged, followed by the pulsing and purging of another process gas such as $H_2$. The two types of gases are pulsed and purged alternatingly to increase the thickness of the silicon capping layer 50 to a desirable thickness. The ALD process may be a thermal ALD process, which is performed, for example, at a temperature in a range between about 350° C. and about 500° C. When CVD is used, precursors such as silane, disilane, hexamethyldisilazane (HMDS), DCS, $H_2$, and/or the like as aforementioned, may be used.

Dummy gate dielectric layer 52 is formed simultaneously as the formation of the gate dielectric of an Input-Output (IO) device, and hence is alternatively referred to as an IO dielectric. In accordance with some embodiments, dummy gate dielectric layer 52 comprises silicon oxide.

Figure 13:
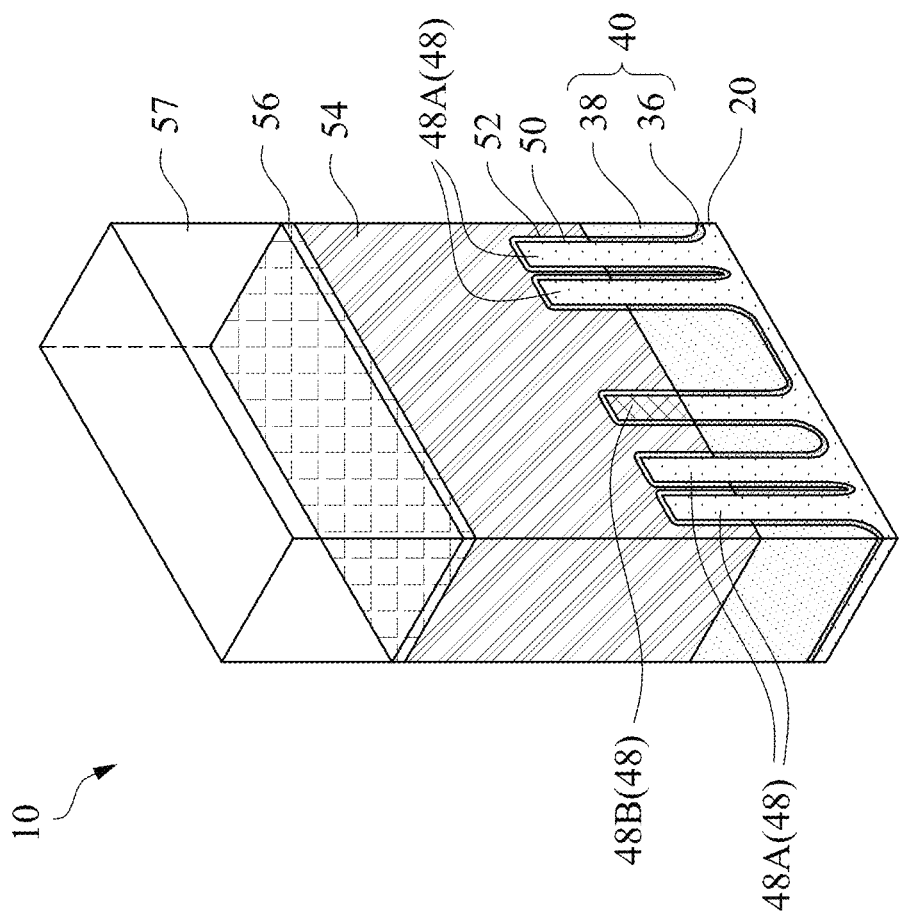

FIG. 13 illustrates the formation of dummy gate electrode layer 54. The respective process is illustrated as process 226 in the process flow 200 as shown in FIG. 31. In accordance with some embodiments, dummy gate electrode layer 54 comprises polysilicon or amorphous silicon. The formation may be performed using precursors including silane, disilane, dichlorosilane ($SiH_2Cl_2$, DCS), Trisilane ($Si_3H_8$), high-order Silane ($Si_nH_{2n+2}$, n>3), Dimethylaminosilane ($SiH_3[N(CH_3)_2]$, DMAS), Ethylmethylaminosilane ($SiH_3[N(CH_3C_2H_5)]$, EMAS), Diethylaminosilane ($SiH_3[N(C_2H_5)_2]$, DEAS), Ethylisopropylaminosilane ($SiH_3[N(C_2H_5C_3H_7)]$, EIPAS), Diisopropylaminosilane ($SiH_3[N(C_3H_7)_2]$, DIPAS), Dipropylaminosilane ($SiH_3[N(C_3H_7)_2]$, DPAS), Dichlorosilane ($SiH_2Cl_2$), Trichlorosilane ($SiHCl_3$), Chlorosilane or the like. The pressure of the precursor may be in the range between about 0.1 Torr and about 5 Torr. The temperature for growing dummy gate electrode layer 54 may be in the range between about 100° C. and about 750° C. Depending on the temperature, the growth rate of dummy gate electrode layer 54, and other process conditions, dummy gate electrode layer 54 may be an amorphous silicon layer, a polysilicon layer, or the mixture thereof. The deposition process may also be performed using CVD, ALD, or the like. The top surface of the deposited dummy gate electrode layer 54 is higher than the top surfaces of protruding fins 48. A planarization process may then be performed to level the top surface of dummy gate electrode layer 54.

Figure 14:
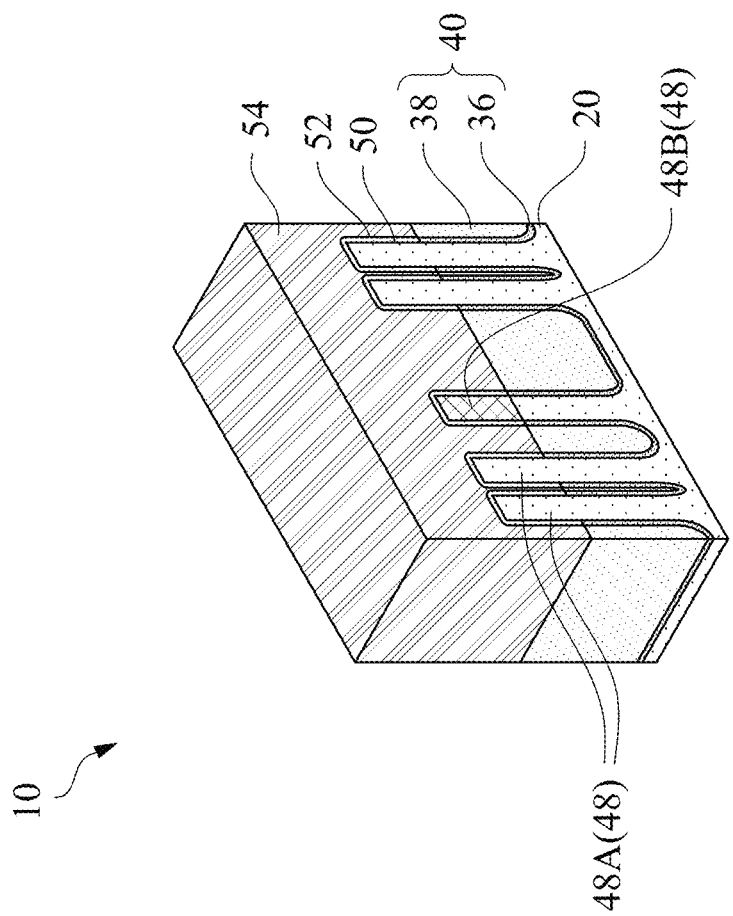

In accordance with some embodiments, a pad layer 56, which may be formed of silicon nitride, silicon oxide, or the like, may be deposited on the top surface of dummy gate electrode layer 54. The pad layer 56 is used for performing other processes, which are not discussed herein. For example, polysilicon layer 57 may be deposited on the pad layer 56. Next, polysilicon layer 57 and the pad layer 56 are removed. Dummy gate electrode layer 54 may then be recessed (thinned) in accordance with some embodiments to a desirable thickness. The resulting structure is shown in FIG. 14. In accordance with alternative embodiments, pad layer 56 is not deposited, and the dummy gate electrode layer 54 is polished to the desirable thickness.

FIGS. 15 through 19 illustrate the formation of dummy gate stacks through a double-patterning process. It is appreciated that depending on the requirement of the device, single patterning processes or quadruple patterning processes may also be used.

Figure 15:
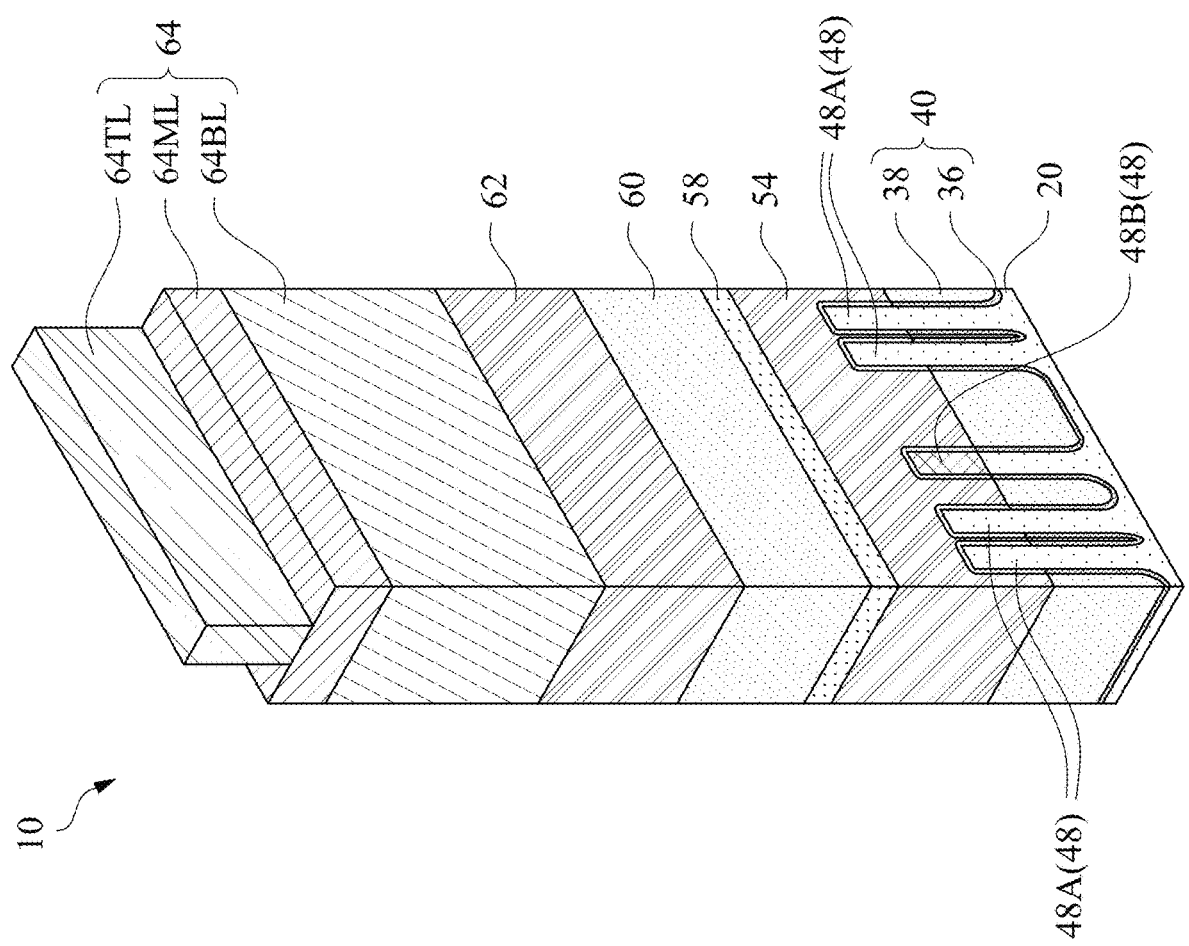

Referring to FIG. 15, hard mask layers are formed. The hard mask layers may include an oxide layer, a nitride layer, or the like, or composite layers thereof. In accordance with some embodiments, hard mask layers includes layers 58 and 60, which may include a silicon oxide layer and a silicon nitride layer over the silicon oxide layer.

Mandrel layer 62 is deposited over hard mask layers 58 and 60. Mandrel layer 62 may be formed of or comprise amorphous silicon, amorphous carbon, tin oxide, or the like. Etching mask 64, which may be a tri-layer, is formed over mandrel layer 62. Etching mask 64 may include bottom layer 64BL, middle layer 64ML over bottom layer 64BL, and top layer 64TL over middle layer 64ML. In accordance with some embodiments, bottom layer 64BL and top layer 64TL are formed of photo resists, with the bottom layer 64BL being cross-linked.

Middle layer 64ML may be formed of an inorganic material, which may be a nitride (such as silicon nitride), an oxynitride (such as silicon oxynitride), an oxide (such as silicon oxide), or the like. Top layer 64TL is patterned.

Figure 16:
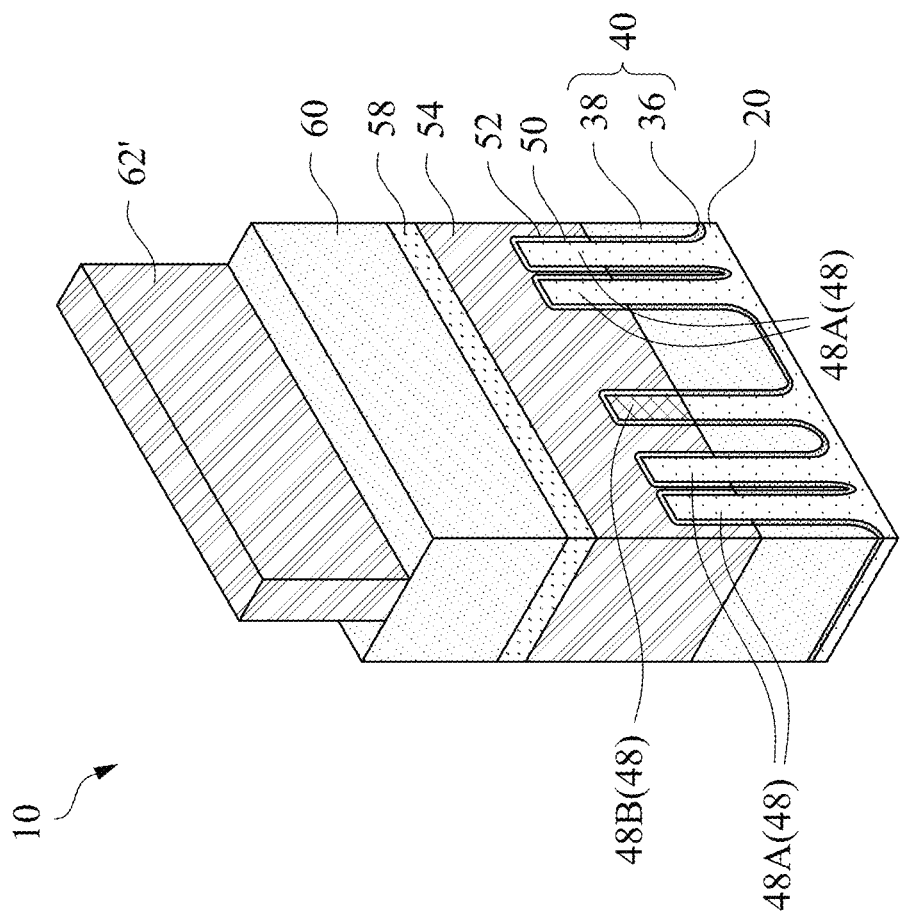

A plurality of etching processes are then performed using the etching mask 64 to define patterns, so that mandrel layer 62 is etched to form mandrel 62'. The respective process is illustrated as process 228 in the process flow 200 as shown in FIG. 31. After the patterning process, the remaining portions of etching mask 64 are removed. The resulting structure is shown in FIG. 16.

Figure 17:
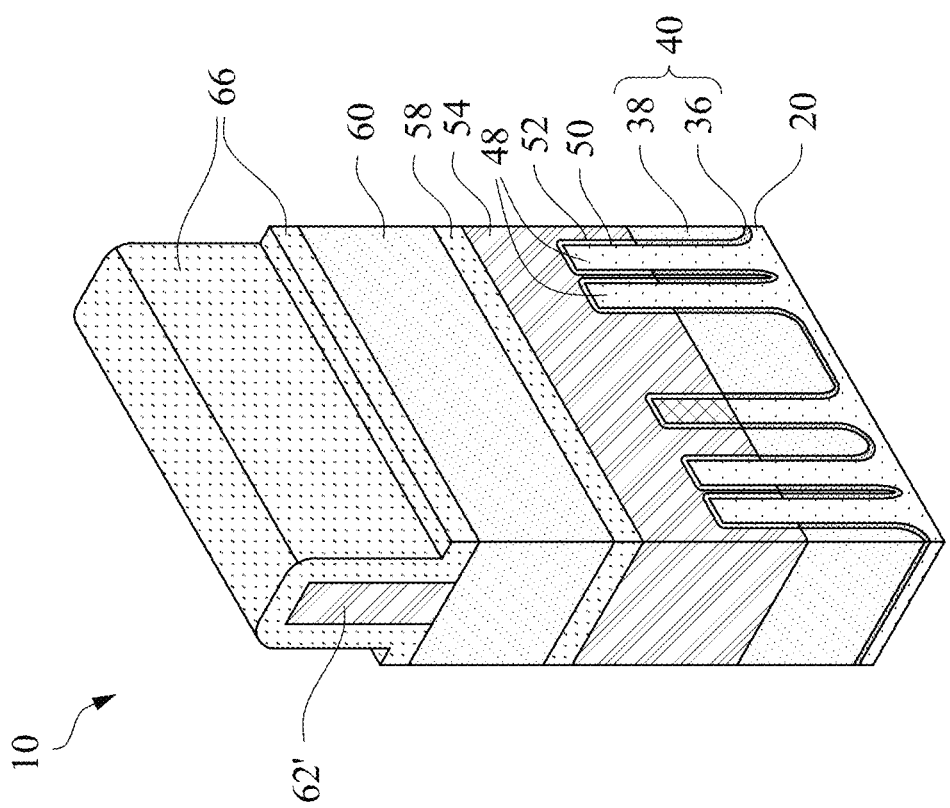

Referring to FIG. 17, spacer layer 66 is deposited. In accordance with some embodiments, spacer layer 66 is formed of or comprises a metal-containing material such as a metal oxide or a metal nitride, for example, titanium oxide, titanium nitride, or the like. Spacer layer 66 is formed as a conformal spacer, which includes vertical portions on the sidewalls of mandrel 62', top horizontal portions on top of mandrel 62', and bottom horizontal portions on top of hard mask layer 60.

Figure 18:
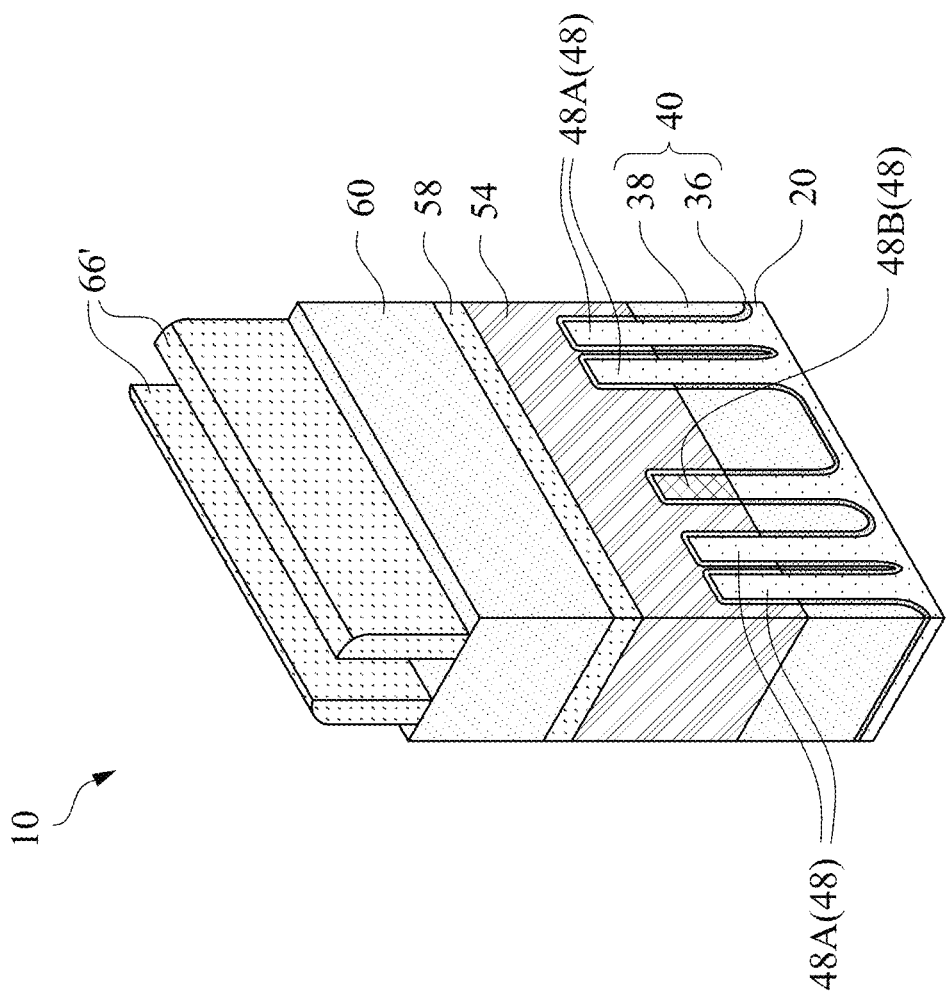

An anisotropic etching process is then performed to remove the top horizontal portions and the bottom horizontal portions, and leaving the vertical portions, which are spacers 66', as shown in FIG. 18. The respective process is illustrated as process 230 in the process flow 200 as shown in FIG. 31. In accordance with some embodiments, the anisotropic etching process is performed using etching gases such as $Cl_2$, HBr, $CH_4$, or the like, or combinations thereof. Carrier gases such as $N_2$, argon, or the like, may also be added into the etching gases. After the etching process, mandrel 62' is removed through an etching process.

Figure 19:
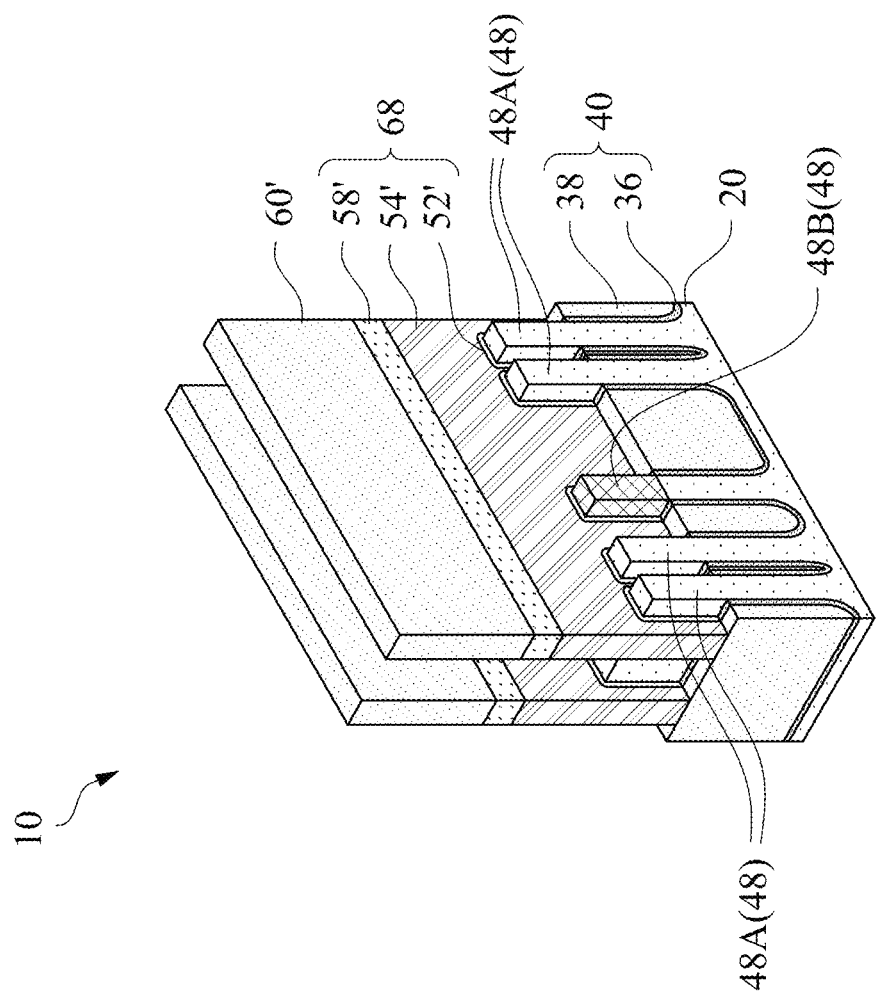

In a subsequent process, hard mask layers 60 and 58 are patterned in anisotropic etching processes, with mandrels 62' being used as an etching mask. The remaining hard masks 60' and 58' are shown in FIG. 19. Hard masks 60' and 58' are then used as an etching mask to etch dummy gate electrode layer 54, and to form dummy gate electrodes 54'. The respective process is illustrated as process 232 in the process flow 200 as shown in FIG. 31. Dummy gate dielectric layer 52 is also etched to form dummy gate dielectrics 52'.

The etching of silicon in dummy gate electrode layer may be performed at a temperature in the range between about 100° C. and about 700° C. The etching gas may include fluorine ($F_2$), Chlorine ($Cl_2$), hydrogen chloride (HCl), hydrogen bromide (HBr), bromine ($Br_2$), $SiH_2Cl_2$, or combinations thereof. The pressure of the etching gas may be in the range between about 0.1 Torr and about 200 Torr. The carrier gas may include $H_2$ and/or $N_2$, which may have flow rates of lower than about 20 slm.

Dummy gate stacks 68 are thus formed. Dummy gate stacks 68 includes dummy gate electrodes 54' and dummy gate dielectrics 52', which are the remaining portions of dummy gate electrode layer 54 and dummy gate dielectric layer 52, respectively. Dummy gate stacks 68 may further includes hard masks 58' and 60', which are the remaining portions of the patterned hard mask layers 58 and 60.

FIGS. 20A, 20B, and 20C illustrate a top view and two cross-sectional views of the structure shown in FIG. 19, wherein protruding fins 48 are bent, and have bending value B being out of specification (greater than 4 nm). FIG. 20A illustrates the top view of three protruding fins 48. FIGS. 20B and 20C illustrate the reference cross-sections 20B-20B and 20C-20C, respectively, in FIG. 20A. Silicon capping layer 50 is not illustrated separately since it may be merged with the protruding fins 48 and the bulk portion of the semiconductor substrate 20. Referring to FIG. 20B. The left fin and the middle fin bend outwardly relative to each other, and the middle fin and the right fin bend inwardly relative to each other. In the cross-section as shown in FIG. 20B, the majority of dummy gate electrode layer 54 has been removed. Due to the bending of protruding fins 48, however, some portions of dummy gate electrode layer 54 are shadowed by the bending protruding fins 48, and are not removed, which are shown as dummy gate residues 54".

FIGS. 21A, 21B, and 21C illustrate a top view and two cross-sectional view of the structure shown in FIG. 19 in accordance with the embodiments of the present disclosure, in which protruding fins 48 have bending value B within specification. Alternatively stated, protruding fins 48 are vertical or substantially vertical, with bending value B smaller than 4 nm. FIG. 21A illustrates the top view of three protruding fins 48. FIGS. 21B and 21C illustrate the reference cross-sections 21B-21B and 21C-21C, respectively, in FIG. 21A. In the cross-section as shown in FIG. 21B, the entirety of dummy gate electrode layer 54 has been removed, and there is no residue left.

Figure 22:
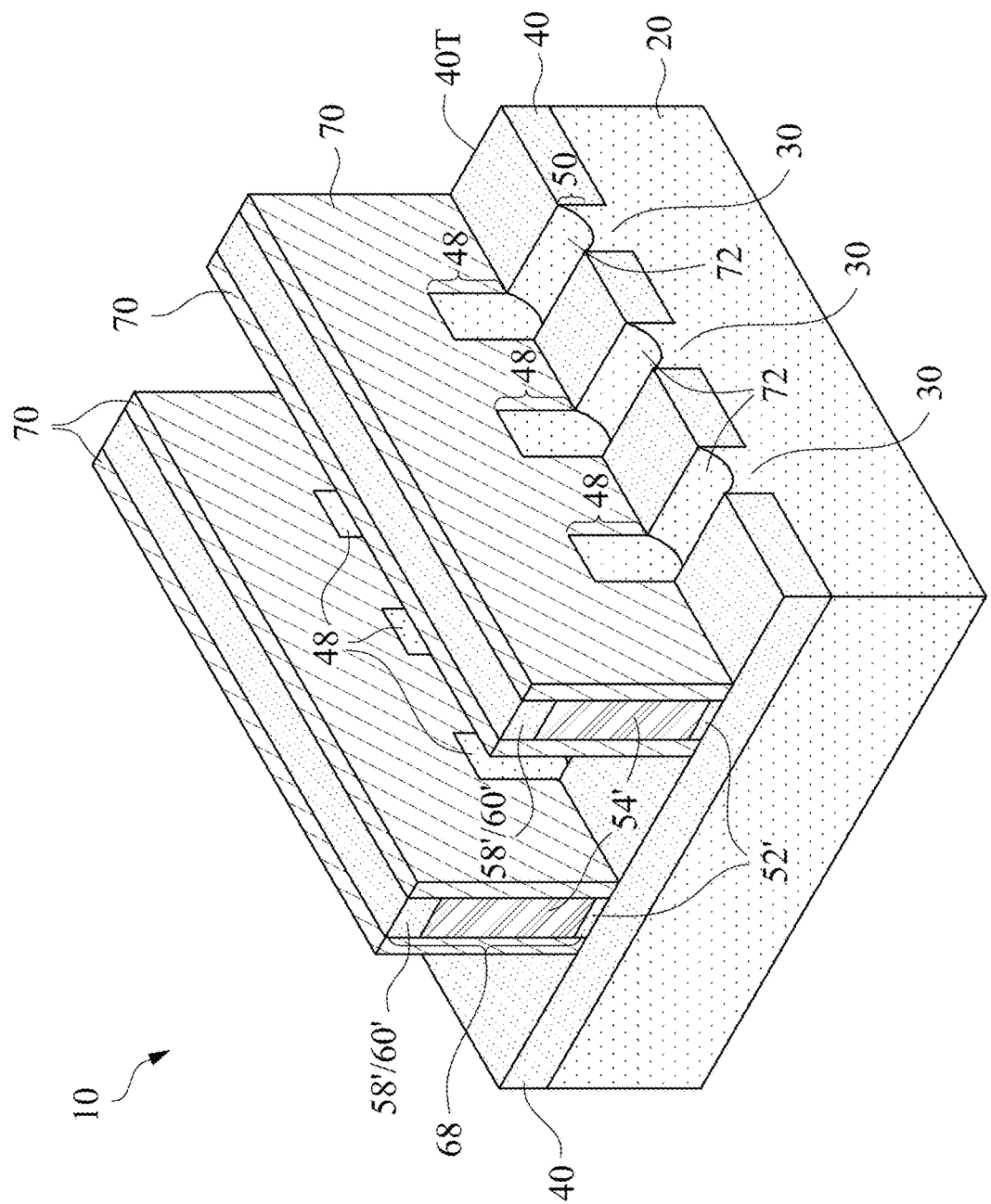

Referring to FIG. 22, gate spacers 70 are formed on the sidewalls of dummy gate stacks 68. In accordance with some embodiments of the present disclosure, gate spacers 70 are formed of a dielectric material(s) such as silicon nitride, silicon oxy-carbo-nitride, or the like, and may have a single-layer structure or a multi-layer structure including a plurality of dielectric layers.

Next, some portions of protruding fins 48 as shown in FIG. 19, which portions are not covered by dummy gate stacks 68 and gate spacers 70, are recessed in an etching process, resulting in the structure shown in FIG. 22. The respective process is illustrated as process 234 in the process flow 200 as shown in FIG. 31. The recessing may be anisotropic, and hence the portions of protruding fins 48 directly underlying dummy gate stacks 68 and gate spacers 70 are protected, and are not etched. The top surfaces of the recessed semiconductor strips 30 may be lower than the top surfaces of STI regions 40 in accordance with some embodiments. Recesses 72 are accordingly formed. Recesses 72 comprise some portions located on the opposite sides of dummy gate stacks 68, and some portions between the remaining portions of protruding fins 48.

Figure 23:
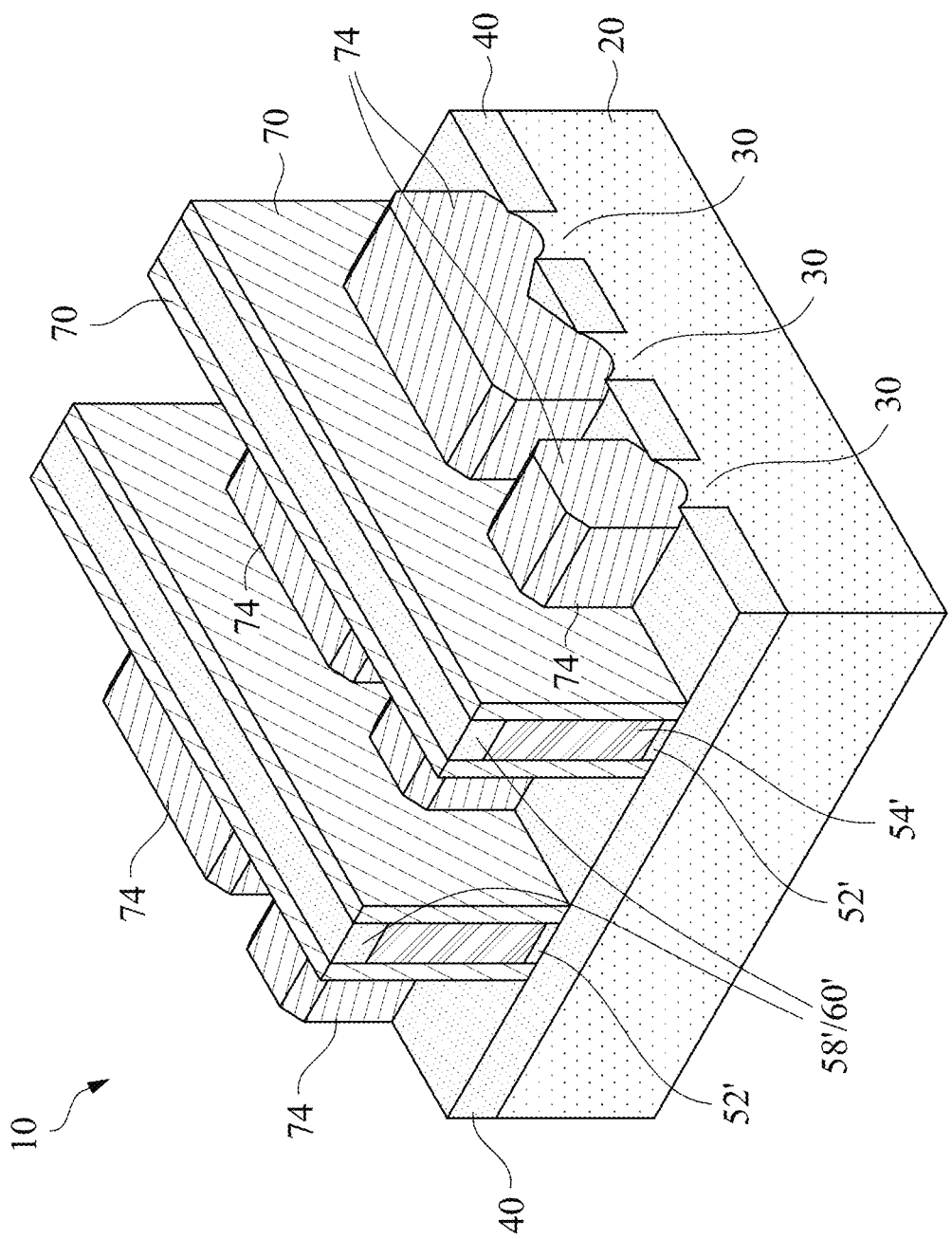

Next, epitaxy regions (source/drain regions) 74 are formed by selectively growing (through epitaxy) a semiconductor material in recesses 72, resulting in the structure in FIG. 23. The respective process is illustrated as process 236 in the process flow 200 as shown in FIG. 31. Depending on whether the resulting FinFET is a p-type FinFET or an n-type FinFET, a p-type or an n-type impurity may be in-situ doped with the proceeding of the epitaxy. For example, when the resulting FinFET is a p-type FinFET, silicon germanium boron (SiGeB), silicon boron (SiB), GeB, or the like may be grown. Conversely, when the resulting FinFET is an n-type FinFET, silicon phosphorous (SiP), silicon carbon phosphorous (SiCP), or the like may be grown. In accordance with alternative embodiments of the present disclosure, epitaxy regions 74 comprise III-V compound semiconductors such as GaAs, InP, GaN, InGaAs, InAlAs, GaSb, AlSb, AlAs, AlP, GaP, combinations thereof, or multi-layers thereof. After Recesses 72 are filled with epitaxy regions 74, the further epitaxial growth of epitaxy regions 74 causes epitaxy regions 74 to expand horizontally. The further growth of epitaxy regions 74 may also cause neighboring epitaxy regions 74 to merge with each other.

Figure 24:
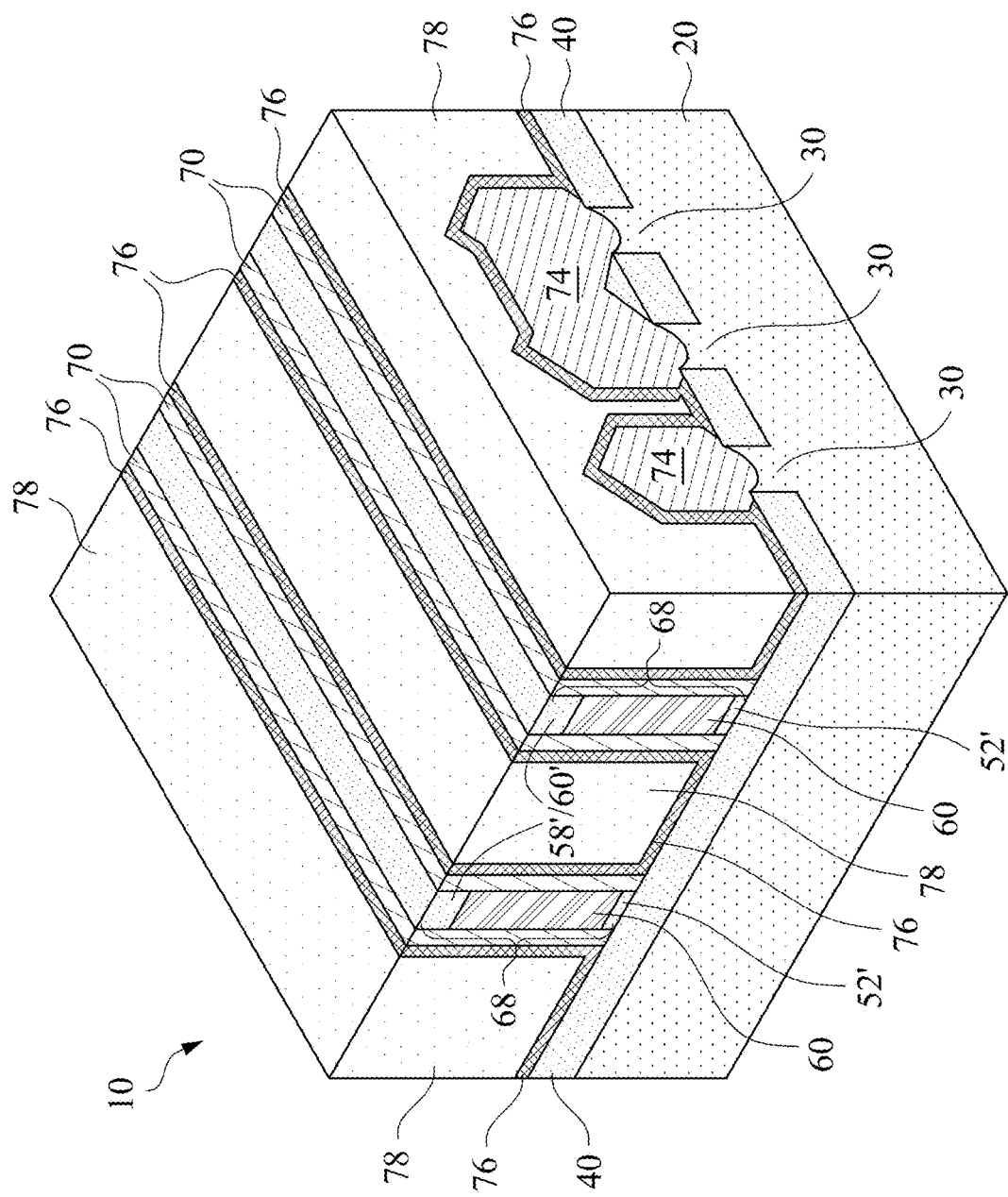

FIG. 24 illustrates a perspective view of the structure after the formation of Contact Etch Stop Layer (CESL) 76 and Inter-Layer Dielectric (ILD) 78. The respective process is illustrated as process 238 in the process flow 200 as shown in FIG. 31. CESL 76 may be formed of silicon oxide, silicon nitride, silicon carbo-nitride, or the like, and may be formed using CVD, ALD, or the like. ILD 78 may include a dielectric material formed using, for example, FCVD, spin-on coating, CVD, or another deposition method. ILD 78 may be formed of an oxygen-containing dielectric material, which may be a silicon-oxide based material such as Tetra Ethyl Ortho Silicate (TEOS) oxide, Phospho-Silicate Glass (PSG), Boro-Silicate Glass (BSG), Boron-Doped Phospho-Silicate Glass (BPSG), or the like. A planarization process such as a CMP process or a mechanical grinding process may be performed to level the top surfaces of ILD 78, dummy gate stacks 68, and gate spacers 70 with each other.

Hard masks 58' and 60', dummy gate electrodes 54', and dummy gate dielectrics 52' are then removed, forming trenches between gate spacers 70, followed by the formation of replacement gate stacks 84. The respective process is illustrated as process 240 in the process flow 200 as shown in FIG. 31. Gate stacks 84 include gate dielectrics 80 and gate electrodes 82. Gate dielectric 80 may include an Interfacial Layer (IL, not shown separately) and a high-k dielectric layer (not shown). The IL is formed on the exposed surfaces of protruding fins 48, and may include an oxide layer such as a silicon oxide layer, which is formed through the thermal oxidation of protruding fins 48, a chemical oxidation process, or a deposition process. The high-k dielectric layer includes a high-k dielectric material such as hafnium oxide, lanthanum oxide, aluminum oxide, zirconium oxide, or the like. The dielectric constant (k-value) of the high-k dielectric material is higher than 3.9, and may be higher than about 7.0. In accordance with some embodiments of the present disclosure, the high-k dielectric layer is formed using ALD, CVD, or the like.

In accordance with some embodiments, gate electrodes 82 includes stacked layers, which may include a diffusion barrier layer (a capping layer), and one or more work-function layer over the diffusion barrier layer. The diffusion barrier layer may be formed of titanium nitride, which may (or may not) be doped with silicon. The work-function layer determines the work-function of the gate electrode, and includes at least one layer, or a plurality of layers formed of different materials. The specific material of the work-function layer may be selected according to whether the respective FinFET is an n-type FinFET or a p-type FinFET. A metal-filling region is then formed on the stacked layers and fully filling the trenches left by the removed dummy gate stacks. The metal-filling region may be formed of or comprise cobalt, tungsten, alloys thereof, or other metal or metal alloys.

Figure 25:
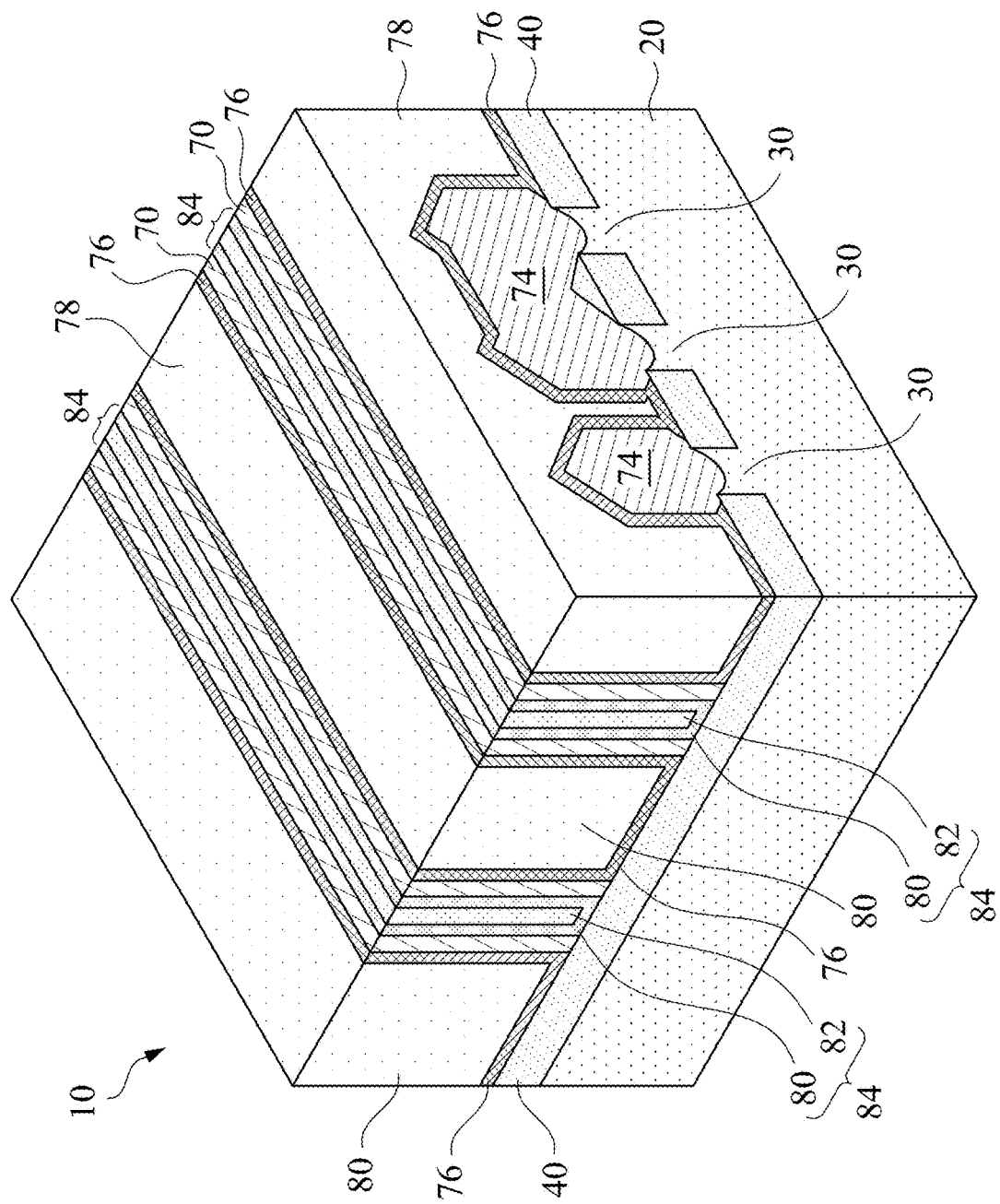

Next, as shown in FIG. 25, a planarization process such as a CMP process or a mechanical grinding process is performed, so that the top surface of gate stacks 84 are coplanar with the top surface of ILD 78. In a subsequent process, gate stacks 84 are etched back, resulting in recesses being formed between opposite gate spacers 70. Next, as shown in FIG. 26, hard masks 86 are formed over replacement gate stacks 84. In accordance with some embodiments of the present disclosure, the formation of hard masks 86 includes a deposition process to form a blanket dielectric material, and a planarization process to remove the excess dielectric material over gate spacers 70 and ILD 78. Hard masks 86 may be formed of silicon nitride, for example, or other like dielectric materials.

In accordance with some embodiments, gate isolation regions 85 may be formed to cut gate stacks 84 into discrete portions. The formation of gate isolation regions 85 may include etching gate stacks 84 to form openings, which separate the otherwise long gate stacks 84 into smaller portions. The openings are filled with a dielectric material(s) to electrically isolate the gate stacks. In the etching of gate stacks 84, if protruding fins 48 are bent with out- of-specification bending value B, the etched gate stacks 84 may also have residues, which may electrically inter-couple the portions of gate stacks 84 that are intended to be electrically isolated. Accordingly, the embodiments of the present disclosure also solve this problem.

FIG. 26 further illustrates some of the features formed in subsequent processes, which may include source/drain silicide regions 88, source/drain contact plugs 90. FinFETs 94 are thus formed.

The embodiments of the present disclosure have some advantageous features. By controlling the ratio of the heights of protruding fins to the depths of STI regions, and/or controlling the uniformity of the spacings between neighboring protruding fins, the bending of protruding fins is controlled. The problems resulted from bent protruding fins are thus solved.

In accordance with some embodiments of the present disclosure, a method comprises etching a semiconductor substrate to form a first trench between a first semiconductor strip and a second semiconductor strip, and a second trench between the second semiconductor strip and a third semiconductor strip, wherein the second trench is deeper than the first trench; filling the first trench and the second trench to form a first isolation region between the first semiconductor strip and the second semiconductor strip, and a second isolation region between the second semiconductor strip and the third semiconductor strip; recessing the first isolation region and the second isolation region, wherein a first protruding fin, a second protruding fin, and a third protruding fin are formed as top portions of the first semiconductor strip, the second semiconductor strip, and the third semiconductor strip, wherein the first protruding fin is spaced apart from the second protruding fin by a first spacing, and the second protruding fin is spaced apart from the third protruding fin by a second spacing substantially equal to the first spacing, wherein bending values of the first protruding fin, the second protruding fin, and the third protruding fin are smaller than about 4 nm; forming a gate stack on the second protruding fin; and forming a source region and a drain region based on the second protruding fin, wherein the gate stack is between the source region and the drain region. In an embodiment, after the recessing, the second protruding fin has a height smaller than both of a first depth of the first isolation region and a second depth of the second isolation region. In an embodiment, the first spacing and the second spacing have a difference smaller than about 4 nm. In an embodiment, the first semiconductor strip is a thin-and-tall fin having a first width at about 5 nm below a top of the first semiconductor strip and a second width at about 60 nm below the top of the first semiconductor strip, wherein the first width is smaller than about 5 nm, and the second width is smaller than about 14.5 nm. In an embodiment, the second protruding fin is also an additional thin-and-tall fin. In an embodiment, the first isolation region is comprised in a device die, and the device die comprises a plurality of FinFETs, and each of the plurality of the FinFETs comprises an additional protruding fin and an additional isolation region immediately next to the additional protruding fin, and wherein throughout an entirety of the device die, heights of all of the additional protruding fins are smaller than depths of corresponding additional isolation regions. In an embodiment, the forming the gate stack comprises forming a dummy gate stack on the first protruding fin; and replacing the dummy gate stack with a replacement gate stack. In an embodiment, the forming the dummy gate stack comprises depositing a dummy gate electrode layer on the first protruding fin; forming a mandrel over the dummy gate electrode layer; forming spacers on opposite sidewalls of the mandrel; removing the mandrel; and etching the dummy gate electrode layer using the spacers as an etching mask, wherein a remaining part of the dummy gate electrode layer forms a part of the gate stack. In an embodiment, the filling the first trench and the second trench are filled using trisilylamine as a precursor. In an embodiment, the recessing the first isolation region results in a top surface of the first isolation region to be curved, with a middle portion of the top surface being lower than edge portions of the top surface, and wherein a depth of the first isolation region is measured from the middle portion of the top surface.

In accordance with some embodiments of the present disclosure, a method comprises etching a semiconductor substrate to form a first trench between a first semiconductor strip and a second semiconductor strip, wherein the first semiconductor strip has a first width at about 5 nm below a top of the first semiconductor strip and a second width at about 60 nm below the top of the first semiconductor strip, wherein the first width is smaller than about 5 nm, and the second width is smaller than about 14.5 nm; filling the first trench with dielectric materials to form a first isolation region; and recessing the first isolation region, with the first isolation region having a first depth after the recessing, wherein a first top portion of the first semiconductor strip protrudes higher than the first isolation region to form a first protruding fin, and the first protruding fin has a first height smaller than the first depth; and forming a gate stack extending on a sidewall and a top surface of the first protruding fin. In an embodiment, the recessing the first isolation region results in a top portion of the second semiconductor strip to protrude higher than the first isolation region and to form a second protruding fin, and the second protruding fin has a second height smaller than the first depth. In an embodiment, after the recessing, a second top portion of the second semiconductor strip protrudes higher than the first isolation region to form a second protruding fin, and wherein after the gate stack is formed, a bending value of the first protruding fin and the second protruding fin is smaller than about 4 nm. In an embodiment, the method further comprises forming a second isolation region between and contacting the second semiconductor strip and a third semiconductor strip, with a top portion of the third semiconductor strip protruding higher than the second isolation region to form a third protruding fin, and wherein the first protruding fin is spaced apart from the second protruding fin by a first spacing, and the second protruding fin is spaced apart from the third protruding fin by a second spacing, and wherein a difference between the first spacing and the second spacing is smaller than about 4 nm, and wherein an additional bending value of the second protruding fin and the third protruding fin is smaller than 4 nm. In an embodiment, the second isolation region has a second depth, and the third protruding fin has a third height smaller than the second depth. In an embodiment, the first isolation region is comprised in a device die, and the device die comprises a plurality of FinFETs, and each of the plurality of the FinFETs comprises an additional protruding fin and an additional isolation region immediately next to the additional protruding fin, and wherein throughout an entirety of the device die, heights of all of the additional protruding fins are smaller than depths of corresponding additional isolation regions. In an embodiment, the forming the gate stack comprises forming a dummy gate stack on the first protruding fin; and replacing the dummy gate stack with a replacement gate stack. In an embodiment, the forming the dummy gate stack comprises depositing a dummy gate electrode layer on the first protruding fin; forming a mandrel over the dummy gate electrode layer; forming spacers on opposite sidewalls of the mandrel; removing the mandrel; and etching the dummy gate electrode layer using the spacers as an etching mask, wherein a remaining part of the dummy gate electrode layer forms a part of the gate stack. In an embodiment, the filling the first trench with the dielectric materials is performed using trisilylamine as a precursor. In an embodiment, the recessing the isolation region results in a top surface of the first isolation region to be curved, with a middle portion of the top surface being lower than edge portions of the top surface, and wherein the first depth is measured from the middle portion of the top surface.

In accordance with some embodiments of the present disclosure, an integrated circuit structure comprises a first protruding fin having a first width at about 5 nm below a first top of the first protruding fin and a second width at about 60 nm below the first top of the first protruding fin, wherein the first width is smaller than about 5 nm, and the second width is smaller than about 14.5 nm; a second protruding fin having a third width at about 5 nm below a second top of the second protruding fin and a fourth width at about 60 nm below the second top of the second protruding fin, wherein the third width is smaller than about 5 nm, and the fourth width is smaller than about 14.5 nm; and a first shallow trench isolation region between the first protruding fin and the second protruding fin, wherein the first shallow trench isolation region has a depth, and wherein a first fin height of the first protruding fin is smaller than the depth, and a bending value of the first protruding fin and the second protruding fin is smaller than 4 nm. In an embodiment, the first fin height is measured from the first top of the first protruding fin to a lowest end of a top surface of the first shallow trench isolation region. In an embodiment, the first protruding fin is comprised in a device die, and the device die comprises a plurality of FinFETs, and each of the plurality of the FinFETs comprises an additional protruding fin and an additional isolation region immediately next to the additional protruding fin, and wherein throughout an entirety of the device die, heights of all of the additional protruding fin are smaller than depths of corresponding additional isolation regions. In an embodiment, the first protruding fin is a silicon fin. In an embodiment, the first protruding fin comprises silicon germanium. In an embodiment, the integrated circuit structure further comprises a third protruding fin; and a second isolation region between the second protruding fin and the third protruding fin, wherein the first protruding fin is spaced apart from the second protruding fin by a first spacing, and the second protruding fin is spaced apart from the third protruding fin by a second spacing, and wherein a difference between the first spacing and the second spacing is smaller than about 4 nm, and wherein an additional bending value of the second protruding fin and the third protruding fin is smaller than about 4 nm. In an embodiment, a top surface of the first shallow trench isolation region is curved, with a middle portion of the top surface being lower than edge portions of the top surface, and wherein the depth is measured at the middle portion.

In accordance with some embodiments of the present disclosure, an integrated circuit structure comprises a bulk semiconductor substrate; a first protruding fin, a second protruding fin, and a third protruding fin adjacent to each other, with the second protruding fin being between the first protruding fin and the third protruding fin, wherein the first protruding fin is spaced apart from the second protruding fin by a first spacing, and the second protruding fin is spaced apart from the third protruding fin by a second spacing, and wherein a difference between the first spacing and the second spacing is smaller than about 4 nm; a first isolation region over the bulk semiconductor substrate and between the first protruding fin and the second protruding fin; and a second isolation region over the bulk semiconductor substrate and between the second protruding fin and the third protruding fin, and wherein a bending value of the second protruding fin and the third protruding fin is smaller than about 4 nm. In an embodiment, a first height of the first isolation region is greater than a depth of the first isolation region. In an embodiment, a first height of the first isolation region is smaller than a depth of the first isolation region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    etching a semiconductor substrate to form a first trench between a first semiconductor strip and a second semiconductor strip, and a second trench between the second semiconductor strip and a third semiconductor strip, wherein the second trench is deeper than the first trench;
    filling the first trench and the second trench to form a first isolation region between the first semiconductor strip and the second semiconductor strip, and a second isolation region between the second semiconductor strip and the third semiconductor strip;
    recessing the first isolation region and the second isolation region, wherein a first protruding fin, a second protruding fin, and a third protruding fin are formed as top portions of the first semiconductor strip, the second semiconductor strip, and the third semiconductor strip, wherein the first protruding fin is spaced apart from the second protruding fin by a first spacing, and the second protruding fin is spaced apart from the third protruding fin by a second spacing substantially equal to the first spacing, wherein bending values of the first protruding fin, the second protruding fin, and the third protruding fin are smaller than about 4 nm;
    forming a gate stack on the second protruding fin; and
    forming a source region and a drain region based on the second protruding fin, wherein the gate stack is between the source region and the drain region.

2. The method of claim 1, wherein after the recessing, the second protruding fin has a height smaller than both of a first depth of the first isolation region and a second depth of the second isolation region.

3. The method of claim 1, wherein the first spacing and the second spacing have a difference smaller than about 4 nm.

4. The method of claim 1, wherein the first semiconductor strip is a thin-and-tall fin having a first width at about 5 nm below a top of the first semiconductor strip and a second width at about 60 nm below the top of the first semiconductor strip, wherein the first width is smaller than about 5 nm, and the second width is smaller than about 14.5 nm.

5. The method of claim 4, wherein the second protruding fin is also an additional thin-and-tall fin.

6. The method of claim 1, wherein the first isolation region is comprised in a device die, and the device die comprises a plurality of Fin Field-Effect Transistors (FinFETs), and each of the plurality of the FinFETs comprises an additional protruding fin and an additional isolation region immediately next to the additional protruding fin, and wherein throughout an entirety of the device die, heights of all of the additional protruding fins are smaller than depths of corresponding additional isolation regions.

7. The method of claim 1, wherein the forming the gate stack comprises:
    forming a dummy gate stack on the first protruding fin; and
    replacing the dummy gate stack with a replacement gate stack.

8. The method of claim 7, wherein the forming the dummy gate stack comprises:
    depositing a dummy gate electrode layer on the first protruding fin;
    forming a mandrel over the dummy gate electrode layer;
    forming spacers on opposite sidewalls of the mandrel;
    removing the mandrel; and
    etching the dummy gate electrode layer using the spacers as an etching mask, wherein a remaining part of the dummy gate electrode layer forms a part of the gate stack.

9. The method of claim 1, wherein the filling the first trench and the second trench are filled using trisilylamine as a precursor.

10. The method of claim 1, wherein the recessing the first isolation region results in a top surface of the first isolation region to be curved, with a middle portion of the top surface being lower than edge portions of the top surface, and wherein a depth of the first isolation region is measured from the middle portion of the top surface.

11. An integrated circuit structure comprising:
    a first protruding fin having a first width at about 5 nm below a first top of the first protruding fin and a second width at about 60 nm below the first top of the first protruding fin, wherein the first width is smaller than about 5 nm, and the second width is smaller than about 14.5 nm;
    a second protruding fin having a third width at about 5 nm below a second top of the second protruding fin and a fourth width at about 60 nm below the second top of the second protruding fin, wherein the third width is smaller than about 5 nm, and the fourth width is smaller than about 14.5 nm; and
    a first shallow trench isolation region between the first protruding fin and the second protruding fin, wherein the first shallow trench isolation region has a depth, and wherein a first fin height of the first protruding fin is smaller than the depth, and a bending value of the first protruding fin and the second protruding fin is smaller than 4 nm.

12. The integrated circuit structure of claim 11, wherein the first fin height is measured from the first top of the first protruding fin to a lowest end of a top surface of the first shallow trench isolation region.

13. The integrated circuit structure of claim 11, wherein the first protruding fin is comprised in a device die, and the device die comprises a plurality of Fin Field-Effect Transistors (FinFETs), and each of the plurality of the FinFETs comprises an additional protruding fin and an additional isolation region immediately next to the additional protruding fin, and wherein throughout an entirety of the device die, heights of all of the additional protruding fin are smaller than depths of corresponding additional isolation regions.

14. The integrated circuit structure of claim 11, wherein the first protruding fin is a silicon fin.

15. The integrated circuit structure of claim 11, wherein the first protruding fin comprises silicon germanium.

16. The integrated circuit structure of claim 11 further comprising:
    a third protruding fin; and
    a second isolation region between the second protruding fin and the third protruding fin, wherein the first protruding fin is spaced apart from the second protruding fin by a first spacing, and the second protruding fin is spaced apart from the third protruding fin by a second spacing, and wherein a difference between the first spacing and the second spacing is smaller than about 4 nm, and wherein an additional bending value of the second protruding fin and the third protruding fin is smaller than about 4 nm.

17. The integrated circuit structure of claim 11, wherein a top surface of the first shallow trench isolation region is curved, with a middle portion of the top surface being lower than edge portions of the top surface, and wherein the depth is measured at the middle portion.

18. An integrated circuit structure comprising:
a bulk semiconductor substrate;
a first protruding fin, a second protruding fin, and a third protruding fin adjacent to each other, with the second protruding fin being between the first protruding fin and the third protruding fin, wherein the first protruding fin is spaced apart from the second protruding fin by a first spacing, and the second protruding fin is spaced apart from the third protruding fin by a second spacing, and wherein a difference between the first spacing and the second spacing is smaller than about 4 nm;
a first isolation region over the bulk semiconductor substrate and between the first protruding fin and the second protruding fin; and
a second isolation region over the bulk semiconductor substrate and between the second protruding fin and the third protruding fin, and wherein a bending value of the second protruding fin and the third protruding fin is smaller than about 4 nm.

19. The integrated circuit structure of claim 18, wherein a first height of the first protruding fin is greater than a depth of the first isolation region, wherein the depth is measured from a bottom surface to a first top surface of the first isolation region, and the first height is measured from the first top surface of the first isolation region to a second top surface of the first protruding fin.

20. The integrated circuit structure of claim 18, wherein a first height of the first protruding fin is smaller than a depth of the first isolation region, wherein the depth is measured from a bottom surface to a first top surface of the first isolation region, and the first height is measured from the first top surface of the first isolation region to a second top surface of the first protruding fin.

* * * * *